US012513906B2

(12) United States Patent
Wu et al.

(10) Patent No.: US 12,513,906 B2
(45) Date of Patent: Dec. 30, 2025

(54) THREE-DIMENSIONAL NAND MEMORY DEVICE HAVING WORD LINE CONTACT WITH DIELECTRIC FILLER

(71) Applicant: Yangtze Memory Technologies Co., Ltd., Hubei (CN)

(72) Inventors: Linchun Wu, Wuhan (CN); Kun Zhang, Wuhan (CN); Wenxi Zhou, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 536 days.

(21) Appl. No.: 17/857,264

(22) Filed: Jul. 5, 2022

(65) Prior Publication Data

US 2024/0015974 A1    Jan. 11, 2024

(51) Int. Cl.
*H10B 43/50* (2023.01)
*H01L 21/768* (2006.01)
*H01L 23/535* (2006.01)
*H10B 43/27* (2023.01)

(52) U.S. Cl.
CPC ....... *H10B 43/50* (2023.02); *H01L 21/76895* (2013.01); *H01L 23/535* (2013.01); *H10B 43/27* (2023.02)

(58) Field of Classification Search
CPC ... H10B 43/50; H10B 43/27; H01L 21/76895; H01L 23/535
See application file for complete search history.

(56) References Cited

U.S. PATENT DOCUMENTS

| | | | |
|---|---|---|---|
| 2015/0349109 A1* | 12/2015 | Lee | H10B 43/35 257/314 |
| 2016/0268301 A1* | 9/2016 | Lee | H10B 43/40 |
| 2017/0117222 A1* | 4/2017 | Kim | H01L 23/5283 |
| 2017/0287926 A1* | 10/2017 | Ariyoshi | H10B 43/10 |
| 2019/0115362 A1* | 4/2019 | Choi | H10B 43/27 |
| 2019/0287894 A1* | 9/2019 | Nakajima | H10B 43/50 |
| 2020/0395373 A1* | 12/2020 | Huo | H01L 21/31111 |
| 2022/0199639 A1* | 6/2022 | Yeh | H10B 43/40 |

* cited by examiner

*Primary Examiner* — Lex H Malsawma
*Assistant Examiner* — Sammantha K Salaz
(74) *Attorney, Agent, or Firm* — Oblon, McClelland, Maier & Neustadt, L.L.P.

(57) ABSTRACT

A semiconductor device semiconductor device includes a stack having a first surface and a second surface opposing the first surface. The stack can include word line layers and insulating layers alternating with the word line layers between the first surface and the second surface. The stack can further include a process stop layer between the lower most insulating layer and the second surface. The stack can extend along an X-Y plane having an X direction and a Y direction perpendicular. The semiconductor device can further include a slit structure crossing the stack between the first surface and the second surface in Z direction. In a cross-section perpendicular to the Y direction, distances between the slit structure and the process stop layer at two sides of the slit structure are each larger than distances at either side of the slit structure between the word line layers and the slit structure.

15 Claims, 18 Drawing Sheets

THREE-DIMENSIONAL NAND MEMORY DEVICE HAVING WORD LINE CONTACT WITH DIELECTRIC FILLER

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit. A 3D NAND memory device is an exemplary device of stacking multiple planes of memory cells to achieve greater storage capacity, and to achieve lower costs per bit. The 3D NAND memory device can include a stack of alternating insulating layers and word line layers over a substrate and a slit structure.

SUMMARY

The present disclosure describes embodiments related to a 3D NAND memory device and a method of forming the same.

According to an aspect of the disclosure, a semiconductor device is provided. The semiconductor device can include a stack having a first surface and a second surface opposing the first surface. The stack can include word line layers and insulating layers alternating with the word line layers between the first surface and the second surface. The stack can further include a process stop layer between the lower most insulating layer and the second surface. The stack can extend along an X-Y plane having an X direction and a Y direction perpendicular to the X direction. The semiconductor device can further include a slit structure crossing the stack between the first surface and the second surface in Z direction perpendicular to the X-Y plane. The slit structure can also extend along a Y-Z plane perpendicular to the X direction. In a cross-section perpendicular to the Y direction, distances between the slit structure and the process stop layer at two sides of the slit structure are each larger than distances at either side of the slit structure between the word line layers and the slit structure.

In an embodiment, materials exist between the slit structure and the word line layers, between the slit structure and the insulating layers, and between the slit structure and the process stop layer. The materials can include a first dielectric structure and a second dielectric structure. The second dielectric structure extends along the slit structure. The first dielectric structure can be positioned below the lowermost word line layer and in between the slit structure and the process stop layer. In an example, the second dielectric structure includes protrusions between neighboring insulating layers and extending to the respective ones of the word line layers.

In an embodiment, the semiconductor device can further include a semiconductor layer positioned below the process stop layer and a channel structure extending in the Z direction through the word line layers and the insulating layers, and further into the semiconductor layer. In an example, the channel structure further comprises a block layer formed along sidewalls of the channel structure and over the semiconductor layer in the Z direction; a charge trapping layer formed along the block layer and over the semiconductor layer in the Z direction; a tunneling layer formed along the charge trapping and over the semiconductor layer in the Z direction; a channel layer formed along the tunneling layer and further extending into the semiconductor layer in the Z direction; a channel isolation layer positioned along the channel layer and over the semiconductor layer in the Z direction; and a channel contact positioned over the channel isolation layer in the Z direction and in contact with the channel layer.

In an embodiment, the semiconductor device can further include a first contact extending from an uppermost insulating layer of the insulating layers in the Y direction to contact one of the word line layers. In an example, the first contact includes a spacer formed along sidewalls of the first contact and over the one of the word line layers, a side portion formed along the spacer, a bottom portion formed over and in contact with the one of the word line layers, a dielectric filler formed along the side portion and over the bottom portion, and a top portion formed over the dielectric filler and in contact with the side portion.

In an embodiment, the semiconductor device can further include a second contact extending from the uppermost insulating layer and through the word line layers and the insulating layers. The second contact includes a spacer formed along sidewalls of the second contact and in contact with the word line layers and the insulating layers, a side portion formed along the spacer, a bottom portion over the process stop layer, a dielectric filler formed along the side portion and over the bottom portion, and a top portion formed over the dielectric filler and in contact with the side portion.

In an embodiment, the semiconductor device can further include an etch stop layer included in the stack and over the alternating word line layers and insulating layers, and a first dummy channel structure extending into the stack from the first surface of the stack and further through the word line layers and the insulating layers and in contact with the etch stop layer.

In an embodiment, the semiconductor device can further include a second dummy channel structure extending into the stack from the first surface of the stack and in contact with a first contact.

In an embodiment, the semiconductor device can further include a cap layer formed over the first surface of the stack and in contact with the stack, and an isolation layer of the stack positioned between the process stop layer and the cap layer, the slit structure further extending through the isolation layer and into the cap layer. In an embodiment, the semiconductor device can further include a first pad structure extending through the cap layer and in contact with the first surface of a semiconductor layer positioned below the process stop layer, and a second pad structure extending through the cap layer and in contact with the bottom portion of the second contact.

Aspects of the disclosure further provide a method of manufacturing a semiconductor device. The method can include forming a first stack of alternating isolation layers and process stop layers over a substrate, the process stop layers including a bottom stop layer above the substrate and a top stop layer above the bottom stop layer, a first isolation layer of the isolation layers being positioned between the substrate and the bottom stop layer, and a second isolation layer of the isolation layers being positioned between the bottom and top stop layers, the first stack extending along an X-Y plane having an X direction and a Y direction perpendicular to the X direction; forming a first dielectric structure extending into the first stack from above the first stack in a Z direction perpendicular to the X-Y plane; forming a second stack of alternating sacrificial layers and insulating layers over the first stack; and forming a slit structure extending through the second stack and into the first dielectric structure in the Z direction.

In an embodiment, the first dielectric structure extends into the first stack and the substrate, or the first dielectric structure extends into the first stack and at least passing the top stop layer. In an embodiment, the slit structure extends into the substrate or extends at least passing the top stop layer. In an embodiment, the slit structure is a sacrificial slit structure, and the method further includes removing the substrate, the first isolation layer, and the bottom stop layer to expose a bottom of the slit structure; and replacing (i) the sacrificial slit structure to form a replaced slit structure and (ii) the sacrificial layers with a conductive material to form word line layers.

In an embodiment, the method can further include forming a channel structure extending through the second stack and further into the substrate. In an example, to form the channel structure further, the method can further include forming a channel opening that includes sidewalls extending through the second stack and the first stack, and a bottom extending into the substrate; oxidizing portions of the bottom and top stop layers that are exposed by the sidewalls of the channel opening to form a bottom oxide layer and a top oxide layer extending into the channel opening along a horizontal direction parallel to the substrate; forming a block layer along the sidewalls and over the bottom of the channel opening; forming a charge trapping layer over the block layer; forming a tunneling layer over the charge trapping layer; forming a channel layer over the tunneling layer; forming a channel isolation layer over the channel layer; and forming a channel contact over the channel isolation layer and in contact with the channel layer.

In an example, the method can further include forming a first contact extending from an uppermost insulating layer of the insulating layers and into the second stack to contact one of the sacrificial layers; forming a second contact extending from the uppermost insulating layer and through the second stack such that the second contact is in contact with the top stop layer; and forming a first dielectric layer of a third stack over the second stack, and an etch stop layer in the first dielectric layer.

In an example, to form the slit structure further, the method can further include forming a trench opening extending through a third stack formed over the second stack, the second stack, and into or crossing the first dielectric structure; and filling the trench opening with a sacrificial semiconductor material to form the slit structure.

In an embodiment, the method can further include removing the substrate and a portion of the channel structure positioned in the substrate; removing the bottom oxide layer, the first isolation layer, and a portion of the first dielectric structure that is below the first isolation layer; removing the block layer, the charge trapping layer, and the tunneling layer that are surrounded by the bottom oxide layer and the first isolation layer; forming a semiconductor layer that is in contact with the bottom stop layer, the slit structure, and the channel structure; and removing a portion of the semiconductor layer, the bottom stop layer, and a portion of the second isolation layer, a remaining portion of the semiconductor layer being in contact with the channel structure, the top stop layer, and the second isolation layer.

In an example, the method can further include forming a first dummy channel structure extending from the second isolation layer and through the first stack and the second stack to contact the etch stop layer; and forming a second dummy channel structure extending from the second isolation layer, through the first stack, and further into the second stack to contact the first contact, a first cap layer being formed to be in contact with the second isolation layer.

In an example, the replacing (i) the sacrificial slit structure to form the replaced slit structure and (ii) the sacrificial layers with the conductive material to form the word line layers further comprises forming a first cap layer to be in contact with the second isolation layer; forming a third stack over the second stack, the third stack including a first dielectric layer and a second dielectric layer; removing the sacrificial slit structure through an etching process to form a slit opening, the slit opening having sidewalls extending from the first cap layer, through the first dielectric structure and the second stack, and the slit opening having a bottom extending into the third stack to expose the second dielectric layer of the third stack; etching the sacrificial layers such that spaces are formed between the insulating layers; filling the spaces with the conductive material to form the word line layers such that the word line layers and the insulating layers are arranged alternatingly; forming a second dielectric structure along sidewalls and over the bottom of the slit opening; and depositing a material over the second dielectric structure in the slit opening to form the replaced slit structure.

In an embodiment, the method can further include forming a second cap layer that is in contact with the first cap layer; forming a first pad structure extending through the first and second cap layers to contact a semiconductor layer that is in contact with a channel structure; and forming a second pad structure extending through the first and second cap layers and the second isolation layer to contact a second contact.

In an embodiment, the first dielectric structure is surrounded by a lowermost insulating layer of the insulating layers and in contact with a lowermost word line layer of the word line layers, the second dielectric structure extends through the first cap layer, the first dielectric structure, and the word line layers and the insulating layers, and the second dielectric structure further includes protrusions extending to and in contact with the word line layers in the horizontal direction parallel to the word line layers.

Aspects of the disclosure can further provide a memory system device. The memory system device can include control circuitry coupled with a memory device. The memory device can include a stack having a first surface and a second surface opposing the first surface, the stack including word line layers and insulating layers alternating with the line layers between the first surface and the second surface, the stack further including a process stop layer between the lower most insulating layer and the second surface, the stack extending along an X-Y plane having an X direction and a Y direction perpendicular to the Z direction; and a slit structure crossing the stack between the first surface and the second surface in Z direction perpendicular to the X-Y plane, the slit structure also extending along a Y-Z plane perpendicular to the X direction. In a cross-section perpendicular to the Y direction, distances between the slit structure and the process stop layer at two sides of the slit structure are each larger than distances at either side of the slit structure between the word line layers and the slit structure.

In an embodiment, materials exist between the slit structure and the word line layers, between the slit structure and the insulating layers, and between the slit structure and the process stop layer. The materials include a first dielectric structure and a second dielectric structure, the second dielectric structure extending along the slit structure, the first dielectric structure positioned below the lowermost word line layer and in between the slit structure and the process stop layer.

In an embodiment, the second dielectric structure includes protrusions between neighboring insulating layers and extending to the respective ones of the word line layers.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
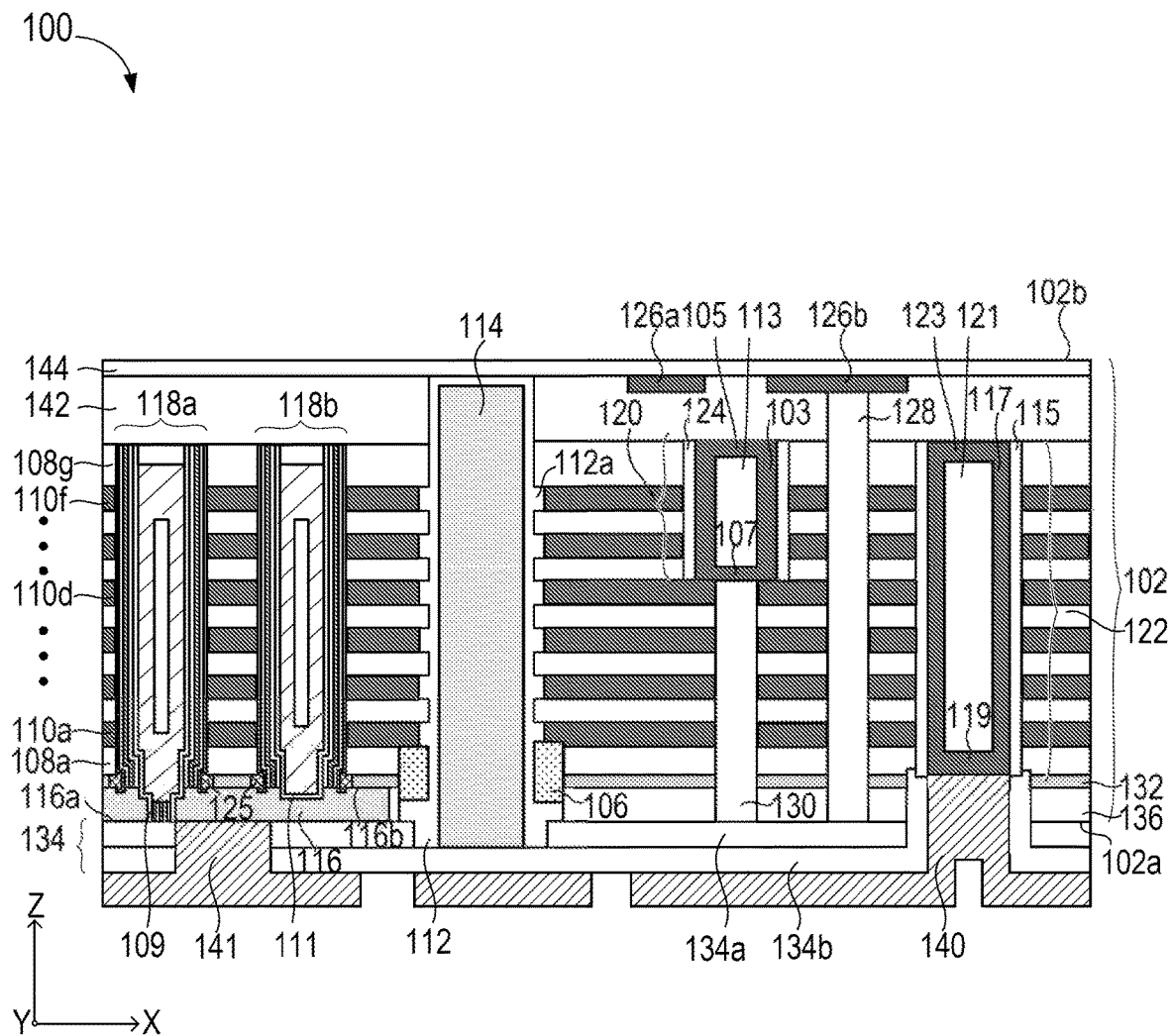
FIG. 1 is a cross-sectional view of a 3D NAND memory device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the number of the word line layers in the 3D NAND memory device increases, the process to form the word line contacts becomes more and more difficult to control. In order to ensure that the word line contacts can stop (or land) on corresponding word line layers accurately, other processes are added, such as TS (topside nitride) SiN and NDC (carbon doped nitride) deposition. Therefore, a new architecture is needed to simplify the process to form the stair steps and the word line contacts.

In the disclosure, stair step contacts (SCTs) can be formed to function as word line contacts. The SCTs can be formed by applying sequential processes that include an oxide deposition, an etching, a tungsten deposition, an oxide filling, and a tungsten plug formation to complete the word line contact formation, and the connection and isolation between the word line contacts and the word line layers. The stair step area around the SCTs can include a tungsten plate stop layer to prevent a backside dummy channel structure (DCH) from punching through the stair step area. A trench structure can be formed under a gate line slit structure (GLS) in advance and filled with an oxide to ensure that the GLS gouging is positioned in the silicon substrate. The backside poly CMP can stop in the oxide layer between a top polysilicon layer and a bottom polysilicon layer, which can be beneficial to control the removal of the GLS sacrificial polysilicon.

In the disclosure, the formation of the oxide trench structure under GLS can help control the position of GLS gouging, which can be beneficial to control the process window to form the back GLS opening. In addition, methods provided in the disclosure can simplify the 3D NAND process flow and reduce the manufacturing cost.

FIG. 1 is a cross-sectional view of a 3D NAND memory device (or device 100), in accordance with exemplary embodiments of the disclosure. The cross-sectional view corresponds to a cross-section perpendicular to the Y direction shown in FIG. 1. As shown in FIG. 1, the device 100 can include alternating word line layers 110a-110f and insulating layers 108a-108g positioned in a stack 102. The alternating word line layers 110a-110f and insulating layers 108a-108g can expand at respective planes in parallel with the X-Y plane. The stack 102 can include a first surface 102a and an opposing second surface 102b disposed in planes parallel with the X-Y plane. The device 100 can include a first dielectric structure 106 positioned in the stack 102, surrounded by a lowermost insulating layer 108a of the insulating layers 108a-108g, and in contact with a lowermost word line layer 110a of the word line layers 110a-110f. In an example, the first dielectric structure 106 is not in contact with the lowermost word line layer 110a. For example, one or more layers/films may be formed between the first dielectric structure 106 and the lowermost word line layer 110a. For example, the lowermost insulating layer 108a may extend between the first dielectric structure 106 and the lowermost word line layer 110a. The device 100 can include a second dielectric structure 112 extending into the stack 102 from the first surface 102a, and through the first dielectric structure 106, the word line layers 110a-110f, and the insulating layers 108a-108g. The device 100 can also include a slit structure (or gate line slit structure or replaced slit structure) 114 extending, along the Z direction, into the stack from the first surface 102a and further through the first dielectric structure 106 and surrounded by the second dielectric structure 112.

In some embodiments, a gate-last fabrication technology can be used to form the device 100, thus the slit structure 114 can be formed to assist in the removal of the sacrificial layers (not shown), and the formation of the real gates (or word line layers) 110a-110f. For example, a slit opening (not shown) can be formed to expose the sacrificial layers, and an etching chemistry can subsequently be introduced from the slit opening to remove the sacrificial layers. A conductive material can further be applied to fill spaces formed by the etching chemistry to form the real gates. In some embodiments, the slit opening can be filled with a conductive material to form the slit structure 114. Thus the slit structure 114 can be made of the conductive material to serve as a contact. In some embodiments, the slit opening can be filled with a dielectric material to form the slit structure 114. Thus, the slit structure 114 can be made of the dielectric material to serve as a separation structure. In an exemplary embodiment of FIG. 1, the slit structure 114 can be made of polysilicon and function as a contact structure. The word line layers 110a-110f can be made of tungsten, polysilicon, or other suitable conduction materials. The insulating layers 108a-108g can be made of SiO or other suitable dielectric materials. It should be noted that FIG. 1 is merely an example, and the device 100 can include any number of slit structures, any number of word line layers, and any number of insulating layers.

The second dielectric structure 112 further can include protrusions 112a extending to and in contact with the word line layers 110a-110f in a horizontal direction (e.g., X direction) parallel to the first surface 102a of the stack 102. In some examples, the protrusions 112a are not in contact with the word line layers 110a-110f. For example, additional one or more layers (such as a layer of TiN) may exist between the protrusions 112a and the respective word line layers 110a-110f. In some embodiments, the first dielectric structure 106 and the second dielectric structure 112 can be made of a same dielectric material, such as SiO. In some embodiments, the first dielectric structure 106 and the second dielectric structure 112 can be made of different dielectric materials, such as SiO, SiC, SiN, SiCN, SiON, or the like.

The stack 102 can include a process stop layer 132 positioned near the bottom of the stack 102, where the alternating word line layers 110a-110f and insulating layers 108a-108g are positioned over the process stop layer 132. The process stop layer 132 can contact the insulating layer 108a. The stack 102 can include an isolation layer 136 that is in contact with the process stop layer 132. In some embodiments, the process stop layer 132 and the isolation layer 136 can be made of different materials. For example, the process stop layer 132 can be made of polysilicon, a metallic material, or other suitable materials. The isolation layer 136 can be made of SiO or other suitable dielectric materials.

The device 100 can include a cap layer 134 formed over the first surface 102a of the stack 102 and in contact with the stack 102. The isolation layer 136 can be positioned between the process stop layer 132 and the cap layer 134. In some embodiments, the cap layer 134 can include a first cap layer 134a in contact with the isolation layer 136 of the stack 102, and a second cap layer 134b in contact with the first cap layer 134a. In some regions, when formed, the second cap layer 134b may extend over a sidewall of an opening that extends vertically across the cap layer 134a and into the stack 102. The opening can contain a portion of a conductive pad structure (such as a pad structure 140). In some embodiments, the first cap layer 134a and the second cap layer 134b can be made of a same dielectric material, such as SiO. In some embodiments, the first cap layer 134a and the second cap layer 134b can be made of different dielectric materials, such as SiO, SiC, SiN, SiCN, SiON, or the like.

The device 100 can include a semiconductor layer 116. The semiconductor layer 116 can include a first surface 116a and an opposing second surface 116b. The semiconductor layer 116 can be positioned in the stack 102, where the first surface 116a of the semiconductor layer 116, in an example, can be level with the first surface 102a of the stack 102. In addition, the semiconductor layer 116 can be positioned between the process stop layer 132 and the cap layer 134. In some embodiments, the semiconductor layer 116 can be made of polysilicon, SiGe, Ge, SiC, or other suitable semiconductor materials. In some embodiments, the semiconductor layer 116 can be doped by a n-type dopant to form a n-type well region.

The device 100 can include a plurality of channel structures. In an exemplary embodiment of FIG. 1, channel structures 118a-118b are provided. The channel structures 118a-118b can extend, along the Z direction, through the word line layers 110a-110f and the insulating layers 108a-108g, and further into the semiconductor layer 116 from the second surface 116b of the semiconductor layer 116. Each of the channel structures 118a-118b can include a high-k layer, a block layer, a charge trapping layer, a tunneling layer, and a channel layer, which can be shown in FIG. 6. It should be noted that the channel layers of the channel structures can have different profiles, for example, due to a process variation when forming the channel structures 118a-118b. For example, the channel structure 118a can include a channel layer 109 that extends from the second surface 116b of the semiconductor layer 116 and through the semiconductor layer 116. The channel structure 118b can include a channel layer 111 that only extends into a top portion of the semiconductor layer 116 from the second surface 116b. For example, the channel structures 118a and 118b, the word line layers 110a-110f and the insulating layers 108a and 108g can be configured to form transistors that are stacked vertically along the Z direction. In some examples, the stack of transistors includes memory cells that form a vertical memory cell string along one of the channel structure 118a or 118b.

The device 100 can optionally include top oxide layers 125 that are positioned over the semiconductor layer 116 and further positioned in the process stop layer 132. The channel structures 118a-118b can be surrounded by the top oxide layers 125. The top oxide layers 125 can function as insolation structures between the channel structures 118a-118b and the process stop layer 132.

The device 100 can include a first contact 120 extending from an uppermost insulating layer 108g of the insulating layers 108a-108g and into a portion of the alternating word line layers 110a-110f and insulating layers 108a-108g to contact one of the word line layers 110a-110f, such as the word line layer 110d. The first contact 120 can include a spacer 124 formed along sidewalls of the first contact 120, a side portion 103 formed along the spacer 124, a bottom portion 107 formed over and in contact with the word line layer 110d, a filler 113 formed along the side portion 103 and over the bottom portion 107, and a top portion 105 formed over the filler 113 and in contact with the side portion 103. In some embodiments, the filler 113 can be made of a dielectric material, such as SiO. In some embodiments, the filler 113 can be made of a conductive material, such as tungsten. In an exemplary embodiment of FIG. 1, the filler 113 is made of SiO. In some embodiments, the first contact 120 can function as a stair step contact (SCT) for the word line layer 110d to provide an operation voltage. In some embodiments, the top portion 105, the bottom portion 107, and the side portion 103 can be made of a conductive material, such as tungsten or other suitable conductive materials.

The device 100 can include a second contact 122 extending from the uppermost insulating layer 108g and through a portion of the alternating word line layers 110a-110f and the insulating layers 108a-108g. The second contact 122 can include a spacer 115 formed along sidewalls of the second contact 122 and in contact with the word line layers 110a-

110f and the insulating layers 108a-108g, a side portion 117 formed along the spacer 115, a bottom portion 119 positioned in the lowermost insulating layer 108a and over the process stop layer 132, a filler 121 formed along the side portion 117 and over the bottom portion 119, and a top portion 123 formed over the filler 121 and in contact with the side portion 117. In some embodiments, the filler 121 can be made of a dielectric material, such as SiO. In some embodiments, the filler 121 can be made of a conductive material, such as tungsten. In an exemplary embodiment of FIG. 1, the filler 121 is made of SiO. In some embodiments, a periphery structure (not shown) can be positioned over the second surface 102b of the stack 102. The periphery structures can include a plurality of transistors that can form control circuitry. The control circuitry can be configured to operate the device 100 for programming (or writing), reading, or erasing the channel structures (e.g., 118a-18b). Accordingly, the second contact 122 can function as an interconnect structure that can be connected to the control circuitry.

The stack 102 can include a first dielectric layer 142 over the word line layers 110a-110f and the insulating layers 108a-108g. The first dielectric layer 142 can further be in contact with the uppermost insulating layer 108g. The stack 102 can include a second dielectric layer 144 over the first dielectric layer 142. A plurality of etch stop layers 126a-126b can be positioned in the first dielectric layer 142 and arranged over the alternating word line layers 110a-110f and insulating layers 108a-108g. In some embodiments, the first dielectric layer 142 and the second dielectric layer 144 can be made of a same dielectric material, such as SiO. In some embodiments, the first dielectric layer 142 and the second dielectric layer 144 can be made of different dielectric materials, such as SiO, SiC, SiN, SiCN, SiON, or the like. In some embodiments, another dielectric layer (not shown) can be formed between the second dielectric layer 144 and the upper surfaces of the etch stop layers 126a-126b. In various examples, the dielectric layer (not shown) between the second dielectric layer 144 and the upper surfaces of the etch stop layers 126a-126b can be made of various materials, such as SiO, SiC, SiN, SiCN, SiON, or the like.

The device 100 can include a first dummy channel structure 128 extending into the stack 102 from the first surface 102a of the stack 102, further through the word line layers 110a-110f and the insulating layers 108a-108g, and in contact with the etch stop layer 126b. The device 100 can include a second dummy channel structure 130 extending into the stack 102 from the first surface 102a of the stack 102, through the word line layers 110a-110d and the insulating layers 108a-108d, and in contact with the first contact 120. In some embodiments, the first dummy channel structure 128 and the second dummy channel structure 130 can serve as sustain components to support the stack 102 when the sacrificial layers (not shown) are removed to form the word line layers 110a-110f. In some embodiments, the first dummy channel structure 128 and the second dummy channel structure 130 can be made of SiO or other suitable dielectric materials.

The device 100 can include a first pad structure 141 extending through the cap layer 134 and in contact with the first surface 116a of the semiconductor layer 116, and a second pad structure 140 extending through the cap layer 134 and in contact with the bottom portion 119 of the second contact 122. The first pad structure 141 and the second pad structure 140 can be coupled to the semiconductor layer 116 and the second contact 122, respectively. Thus, external operation voltages can be applied to the semiconductor layer 116 and the second contact 122 through the first pad structure 141 and the second pad structure 140, respectively. In some embodiments, the first pad structure 141 and the second pad structure 140 can be made of a conductive material, such as Al, Cu, W, or the like.

In the device 100 disclosed in FIG. 1, the first dielectric structure 106 can be a trench structure that extends in a Y direction. The first dielectric structure 106 can be formed prior to the formation of the slit structure 114. For example, the first dielectric structure 106 can be formed to extend through the process stop layer 132, and the slit structure 114 can subsequently be formed to extend through the first dielectric structure 106. As mentioned above, the process stop layer 132 can be made of polysilicon and the first dielectric structure 106 can be made of SiO. An etch rate of the process stop layer 132 can be smaller than an etch rate of the first dielectric structure 106. Thus, the formation of the first dielectric structure 106 can ensure the slit structure 114 extends through the stack 102 and into the cap layer 134. In addition, the device 100 can include the etch stop layers 126a and 126b that can prevent the dummy channel structures from extending through the stack 102. The process stop layer 132 can also be formed to prevent the second contact 122 punching through the stack 102.

Figure 2:
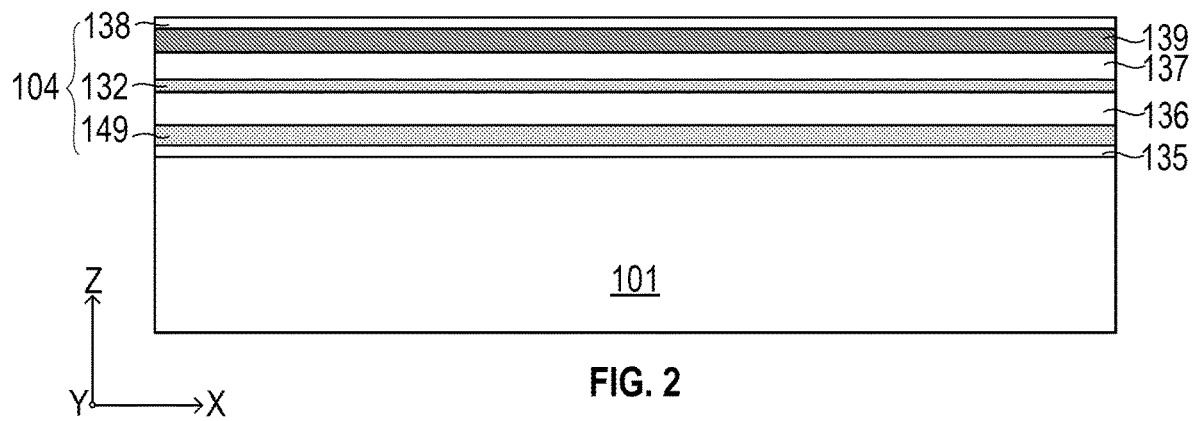
FIGS. 2-25 are cross-sectional views of various intermediate steps of manufacturing the 3D NAND memory device, in accordance with exemplary embodiments of the disclosure.

FIGS. 2-25 are cross-sectional views of various intermediate steps of manufacturing the 3D NAND memory device 100, in accordance with exemplary embodiments of the disclosure. The cross-sectional views correspond to a cross-section perpendicular to the Y direction shown in FIGS. 2-25. As shown in FIG. 2, a stack 104 of alternating isolation layers 135-138 and process stop layers 149, 132, and 139 (or referred to as stop layers) can be formed over a substrate 101. The substrate 101 can extend in a plane in parallel with the X-Y plane shown in FIG. 2. In some embodiments, the isolation layers 135-138 can be made of SiO, the process stop layers 132 and 149 can be made of polysilicon, and the process stop layer 139 can be made of SiN, for example. The isolation layers 135-138 and the process stop layers 132, 149, and 139 can be formed by any suitable deposition processes, such as a chemical vapor deposition (CVD), a physical vapor deposition (PVD), an atomic layer deposition (ALD), an e-bean evaporation, a sputtering, a diffusion, or any combination thereof.

Figure 3:
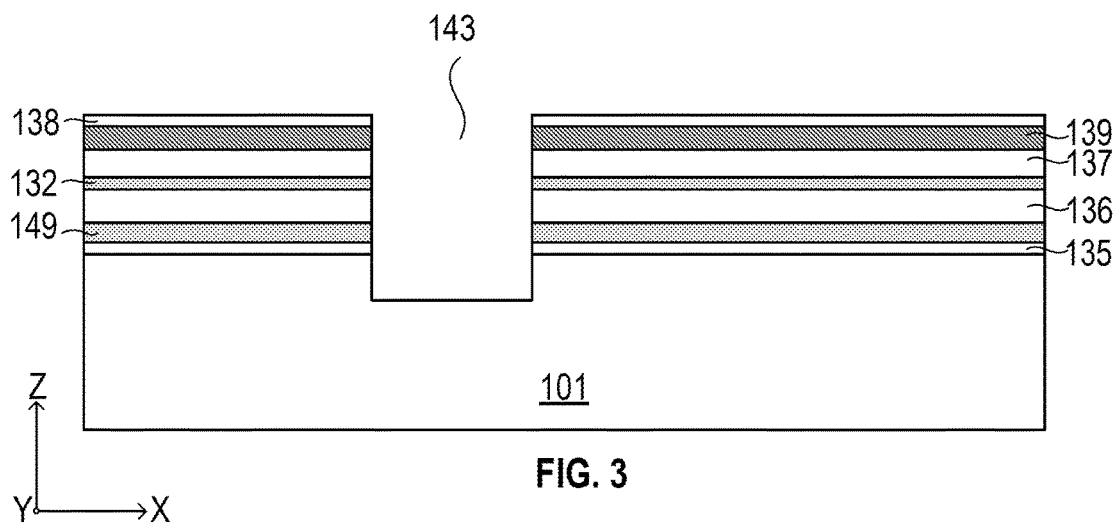

In FIG. 3, a trench opening 143 can be formed. The trench opening 143 can extend from the isolation layer 138 and through the stack 104, and into the substrate 101. The trench opening 143 can further extend in the Y direction. In order to form the trench opening 143, a mask layer with patterns can be formed by a photolithography process, and an etching process can be applied to transfer the patterns into the stack 104 to form the trench opening 143. In another example (not shown), the trench opening 143 can extend through the process top layers 132 and 149 and may not extend into the substrate 101. Forming the opening 143 in such a way can still be effective to secure that the later formed sacrificial slit structure 164 (shown in FIG. 10) can penetrate the process top layers 132 and 149 and extend into (be recessed into) the substrate 101.

Figure 4:
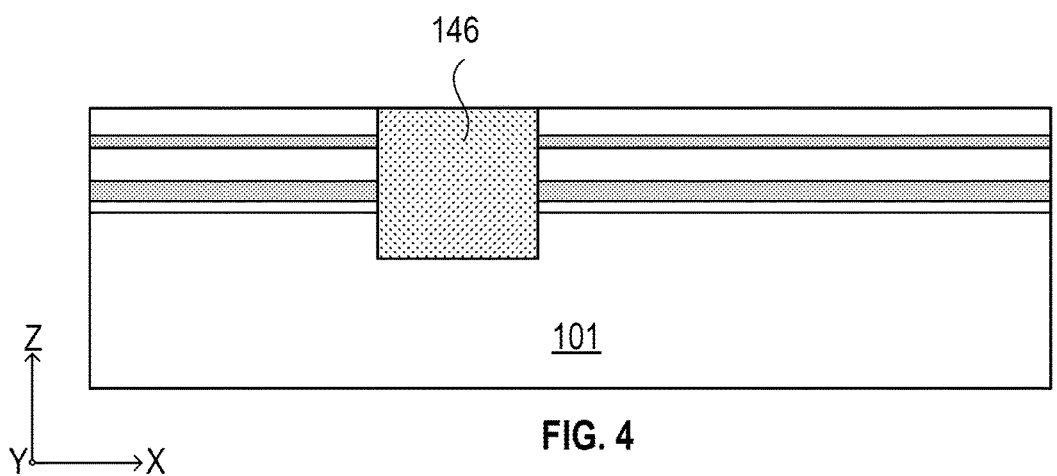

In FIG. 4, a dielectric material, such as SiO, can be applied to fill in the trench opening 143. Any excessive dielectric material over the isolation layer 138 can be removed by a surface planarization process, such as a chemical mechanical planarization (CMP) process. In some embodiments, the process stop layer 139 can function as a CMP stop layer. Thus, the CMP can further remove the isolation layer 138 and the process stop layer 139, and stop at the isolation layer 137. The dielectric material remaining in the trench opening 143 can become a dielectric structure 146. In some examples, the stop layer 132 functions as the CMP stop layer. The isolation layer 137 and the dielectric structure 146 above the stop layer 132 can be removed. In an example, an ONO stack structure can subsequently be formed over the dielectric structure 146 and the stop layer 132. In an example, a lowermost insulating layer (the layer 108a, for example) can subsequently be formed over the dielectric structure 146 and the stop layer 132. In these examples, the upper surface of the dielectric structure 146 may not be in contact with a lowermost word line layer (the layer 110a, for example) in a fabricated device.

Figure 5:
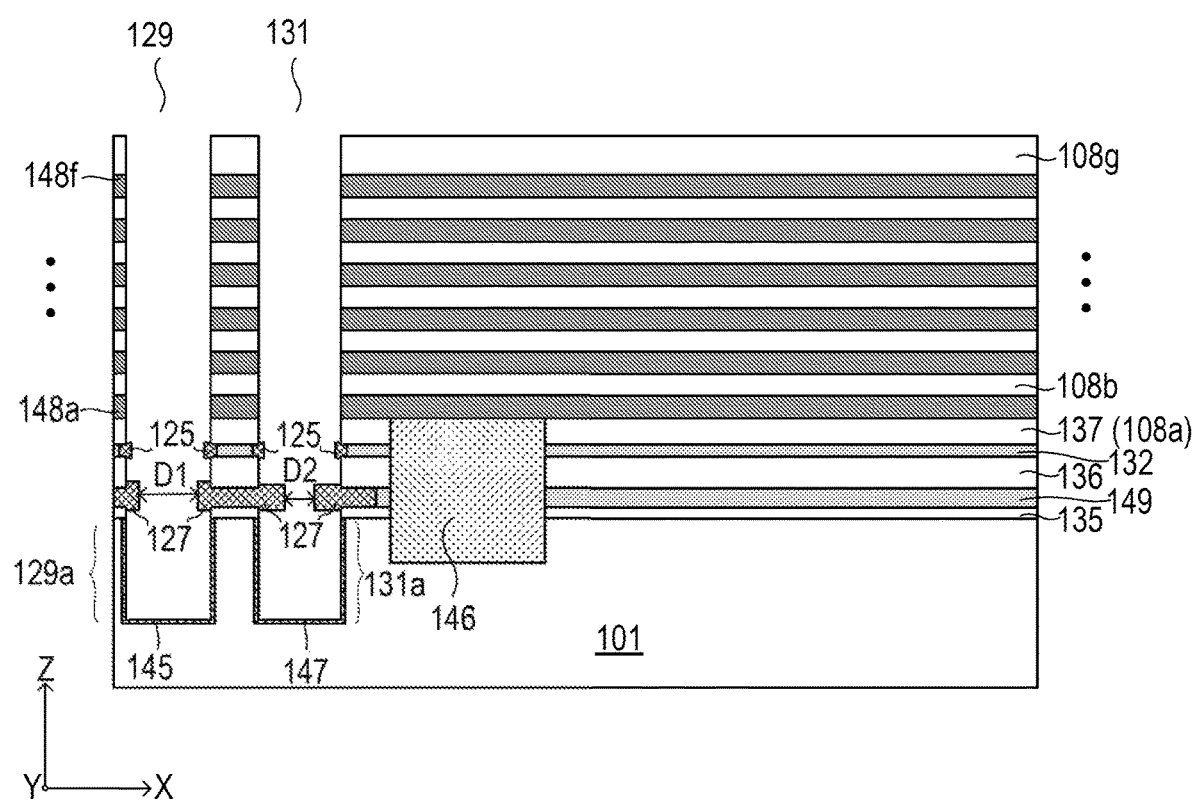

In FIG. 5, sacrificial layers 148a-148f and insulating layers 108b-108g can be deposited alternatingly over the isolation layer 137. The isolation layer 137 can function as a lowermost insulating layer 108a that can separate a lowermost sacrificial layer 148a from the process stop layer 132. A first channel opening 129 and a second channel opening 131 can be formed subsequently by a combination of a photolithography process and an etching process. The first channel opening 129 and the second channel opening 131 can extend through the sacrificial layers 148a-148f, the insulating layers 108a-108g, the process stop layers 132 and 149, and the isolation layers 135-136. The first channel opening 129 and the second channel opening 131 can further extend into the substrate 101 to form recess regions 129a and 131a, respectively.

Still referring to FIG. 5, the process stop layers 132 and 149 can be exposed at sidewalls of the first and second channel openings 129 and 131. An oxidization process, such as a diffusion process by using oxygen gas or an in-situ steam generation (ISSG) process, can be applied to oxidize portions of the process stop layers 132 and 149 that are exposed at sidewalls of the first and second channel openings 129 and 131. Accordingly, bottom oxide layers 127 can be formed by oxidizing the exposed portions of the process stop layer 149 and top oxide layers 125 can be formed by oxidizing the exposed portions of the process stop layer 132. The bottom oxide layers 127 and the top oxide layers 125 can extend into the first and second channel openings 129 and 131 along the horizontal direction (e.g., X direction) parallel to the substrate 101. The oxidization process can further oxidize portions of the substrate that are exposed in the recess regions 129a and 131a to form oxide layers 145 and 147, respectively. It should be noted that, due to a process variation, distances between bottom oxide layers 127 in the first channel opening 129 can be different from distances between bottom oxide layers 127 in the second channel opening 131. For example, as shown in FIG. 5, the adjacent bottom oxide layers 127 in the first channel opening 129 can have a distance D1 that is larger than a distance D2 between the adjacent bottom oxide layers 127 in the second channel opening 131.

Figure 6:
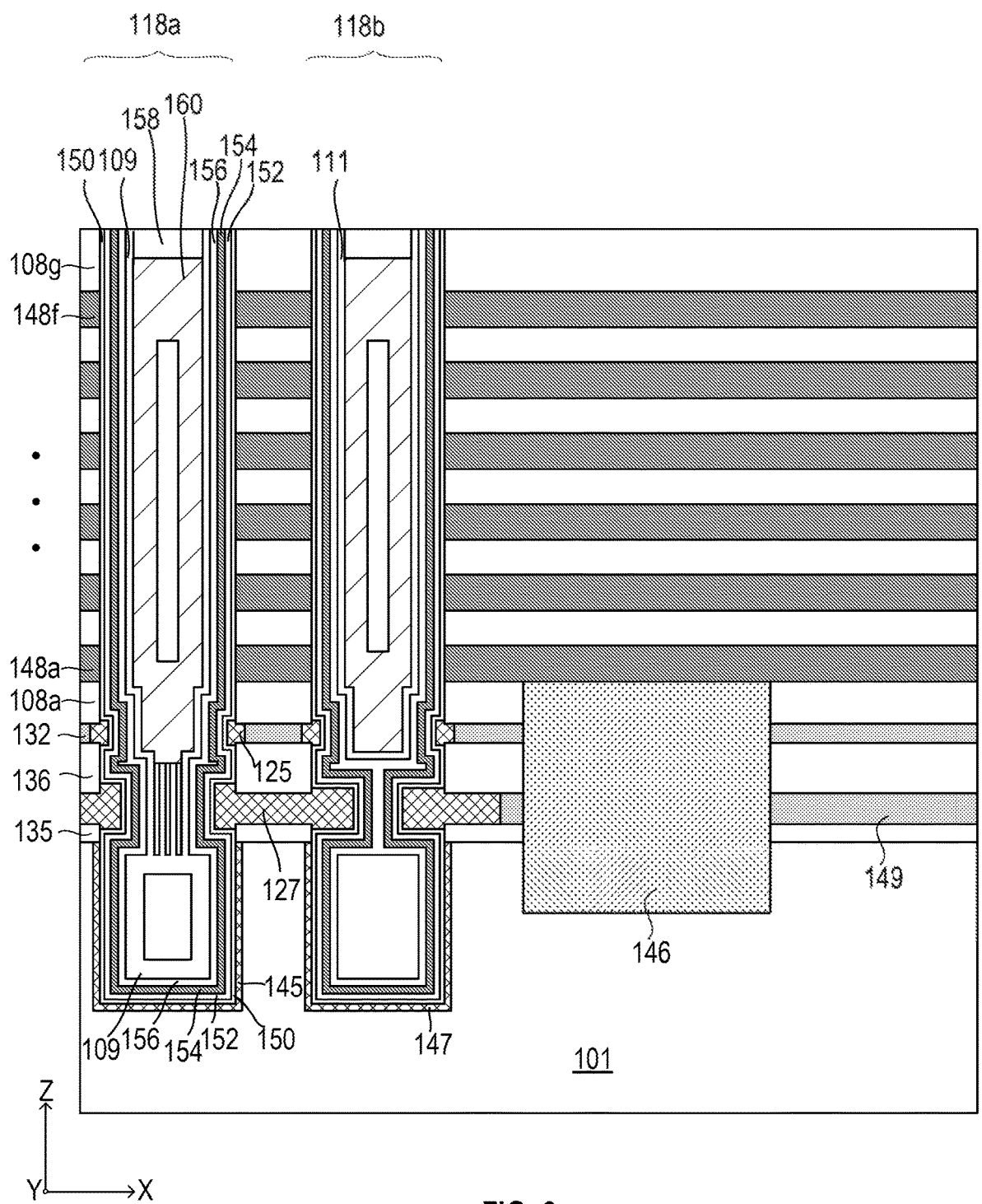
Figure 7:
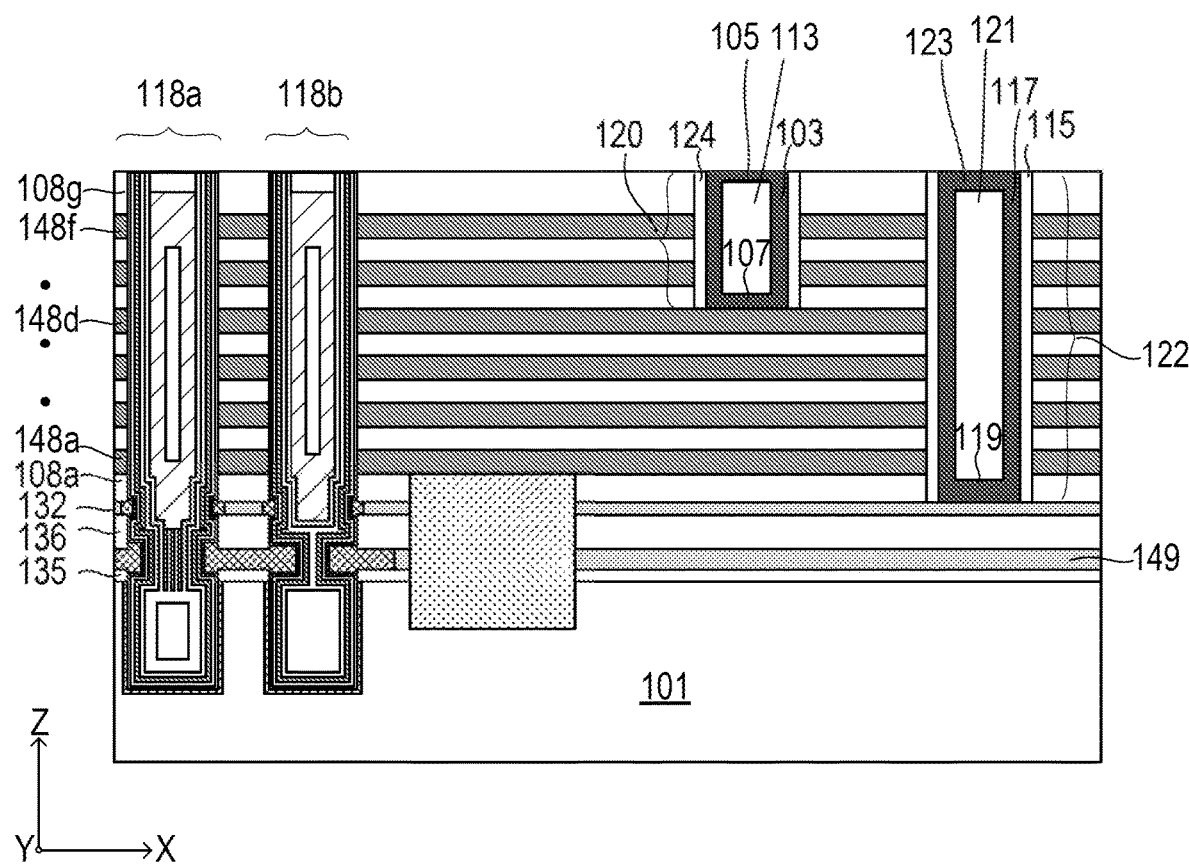

In FIG. 6, channel structures 118a-118b can be formed. Each of the channel structures 118a-118b can include a high-k layer, a block layer, a charge trapping layer, a tunneling layer, a channel layer, a channel isolation layer, and a channel contact. For example, as shown in FIG. 6, the channel structure 118a can include a high-k layer 150 positioned along sidewalls of the first channel opening 129 and over the recess region 129a in the substrate 101. The high-k layer 150 can extend through the sacrificial layers 148a-148f and the insulating layers 108a-108g. The channel structure 118a can include a block layer 152 adjacent to the high-k layer 150 at the inward side of the high-k layer 150, a charge trapping layer 154 adjacent to the block layer 152 at the inward side of the block layer 152, a tunneling layer 156 adjacent to the charge trapping layer 154 at the inward side of the charge trapping layer 154, and a channel layer 109 adjacent to the tunneling layer 156 at the inward side of the tunneling layer 156. The channel structure 118a can include a channel isolation layer 160 formed over the channel layer 109 and a channel contact 158 positioned above the channel isolation layer 160 in the Z direction and in contact with the channel layer 109. It should be noted that the channel layers of the channel structures can have different profiles. For example, the channel layer 109 of the channel structure 118a can extend through the bottom oxide layer 127 and formed at the recess region 129a. However, the channel layer 111 of the channel structure 118b may not exist in the recess region 131a. The different profiles of the channel layers can be driven by the distance variations (e.g., D1 and D2) shown in FIG. 5. In an embodiment, a dielectric layer (not shown) can be formed over the insulating layer 108g and the channel structures 118a-118b after the channel structures 118a-118b are formed and before the processes shown in FIG. 7 are performed. The dielectric layer can be made of various materials in various examples, such as SiO, SiC, SiN, SiCN, SiON, or the like. FIG. 7 shows an example where the above dielectric layer (not shown) is not formed over the insulating layer 108g and the channel structures 118a-118b before the processes shown in FIG. 7 are performed.

In FIG. 7, a first contact 120 can be formed to extend from an uppermost insulating layer 108g of the insulating layers 108a-108g and into a portion of the alternating sacrificial layers 148a-148f and insulating layers 108a-108g to contact one of the sacrificial layers 148a-148f, such as the sacrificial layer 148d. The first contact 120 can include a spacer 124 formed along sidewalls of a contact opening containing the first contact 120, a side portion 103 formed along the spacer 124, a bottom portion 107 formed over and in contact with the sacrificial layer 148d, a filler 113 formed along the side portion 103 and over the bottom portion 107, and a top portion 105 formed over the filler 113 and in contact with the side portion 103. In order to form the first contact 120, a contact opening (not shown) can be formed to extend through a portion of the insulating layers 108e-108g and the sacrificial layers 148e-148f. The contact opening can further expose the sacrificial layer 148d. The spacer 124 can be formed along sidewalls and a bottom of the contact opening. The spacer 124 positioned over the bottom of the contact opening can further be etched away. The side portion 103 can be formed along sidewalls of the spacer 124, and the bottom portion 107 can be formed over the sacrificial layer 148d. Further, the filler 113 can be formed along the side portion 103 and over the bottom portion 107. The top portion 105 can further be formed over the filler 113 and in contact with the side portion 103.

Still in FIG. 7, a second contact 122 can also be formed to extend from the uppermost insulating layer 108g and through the sacrificial layers 148a-148f and the insulating layers 108a-108g. The second contact 122 can include a spacer 115 formed along sidewalls of a contact opening containing the second contact 122 and in contact with the sacrificial layers 148a-148f and the insulating layers 108a-108g, a side portion 117 formed along the spacer 115, a bottom portion 119 positioned in the lowermost insulating layer 108a and over the process stop layer 132, a filler 121 formed along the side portion 117 and over the bottom portion 119, and a top portion 123 formed over the filler 121 and in contact with the side portion 117.

Figure 8:
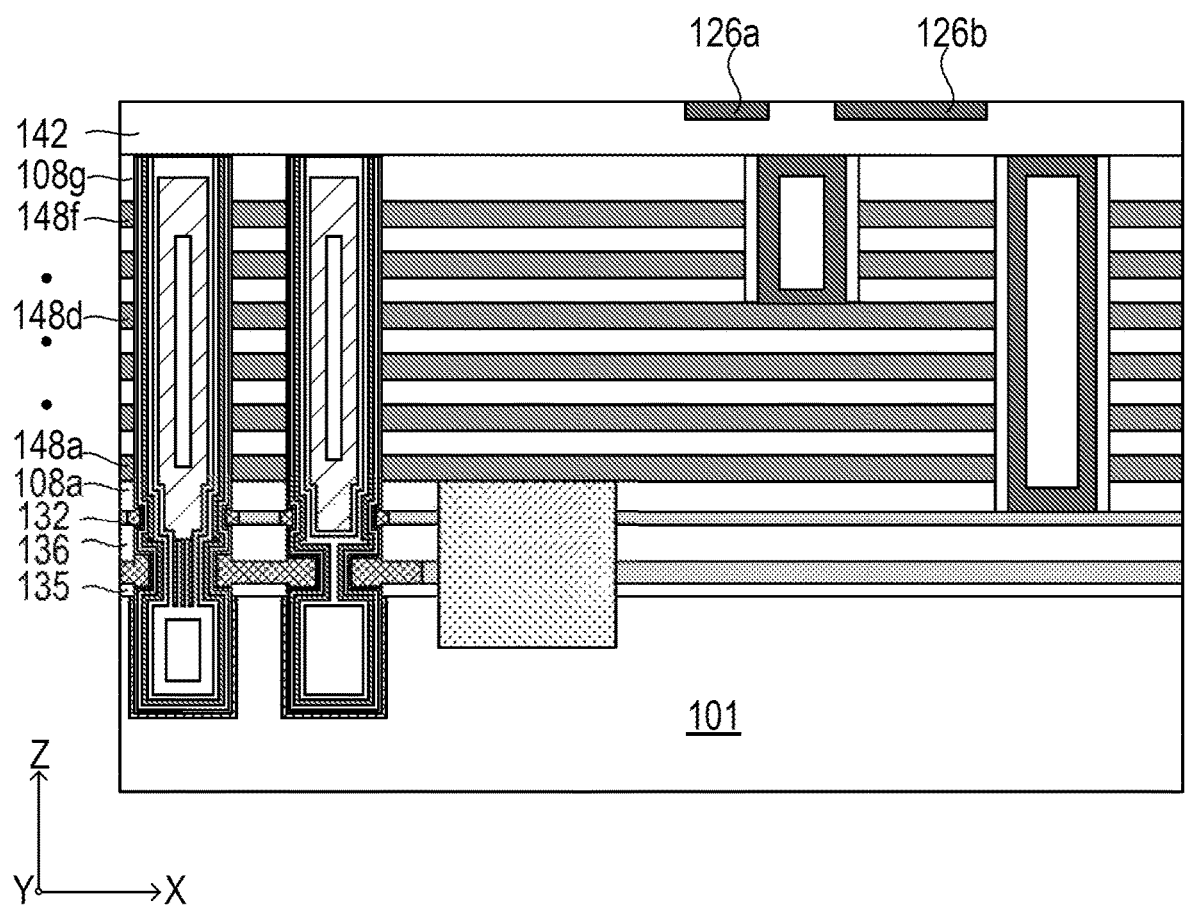

In FIG. 8, a first dielectric layer 142 can be formed over the uppermost insulating layer 108g. Further, a plurality of etch stop layers 126a-126b can be formed in the first dielectric layer 142. In order to form the first dielectric layer 142, a deposition process, such as a CVD process, can be applied. The etch stop layers 126a-126b can be formed by forming openings (not shown) in the first dielectric layer through a combination of a photolithography process and an etching process. In an example, the openings can further be filled with a conductive material, such as tungsten. Any excessive conductive material over the first dielectric layer 142 can be removed by a CMP process. In an example, the openings can be filled with a non-conductive or semi conductive material. In an example, the openings can be filed with SiO or other suitable dielectric materials. In an embodiment, a dielectric layer (not shown) can be formed over the surface of the first dielectric layer 142 and the etch stop layers 126a-126b after the CMP process and before subsequent processes shown in FIG. 9. In another embodiment, as shown in FIG. 9, the above dielectric layer formed over the surface of the first dielectric layer 142 and the etch stop layers 126a-126b after the CMP process is not formed before the subsequent processes shown in FIG. 9.

Figure 9:
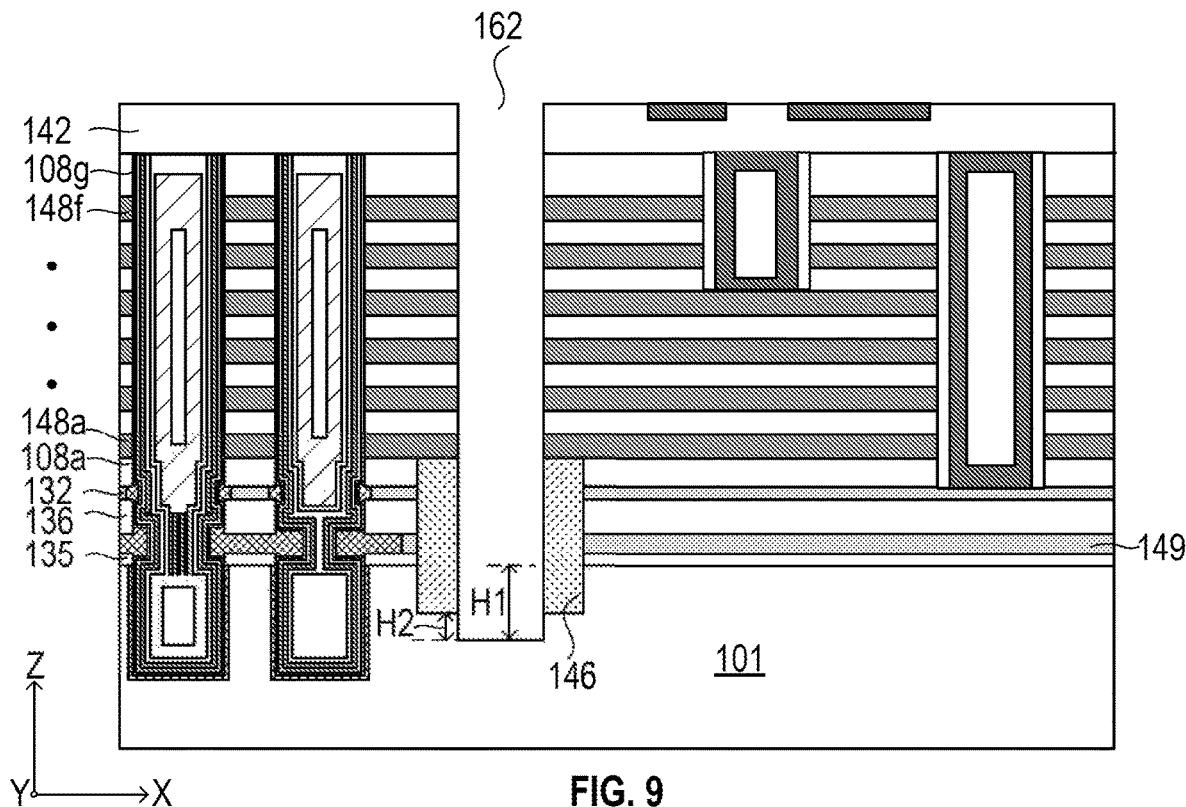
Figure 11:
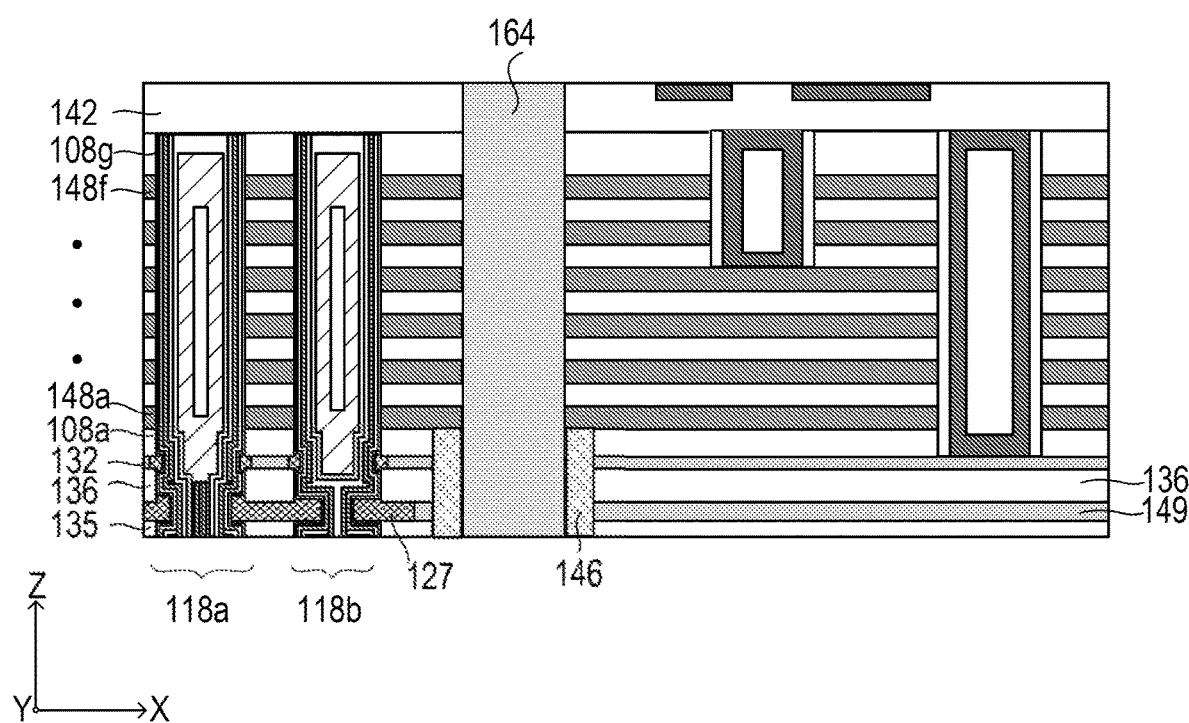
Figure 18:
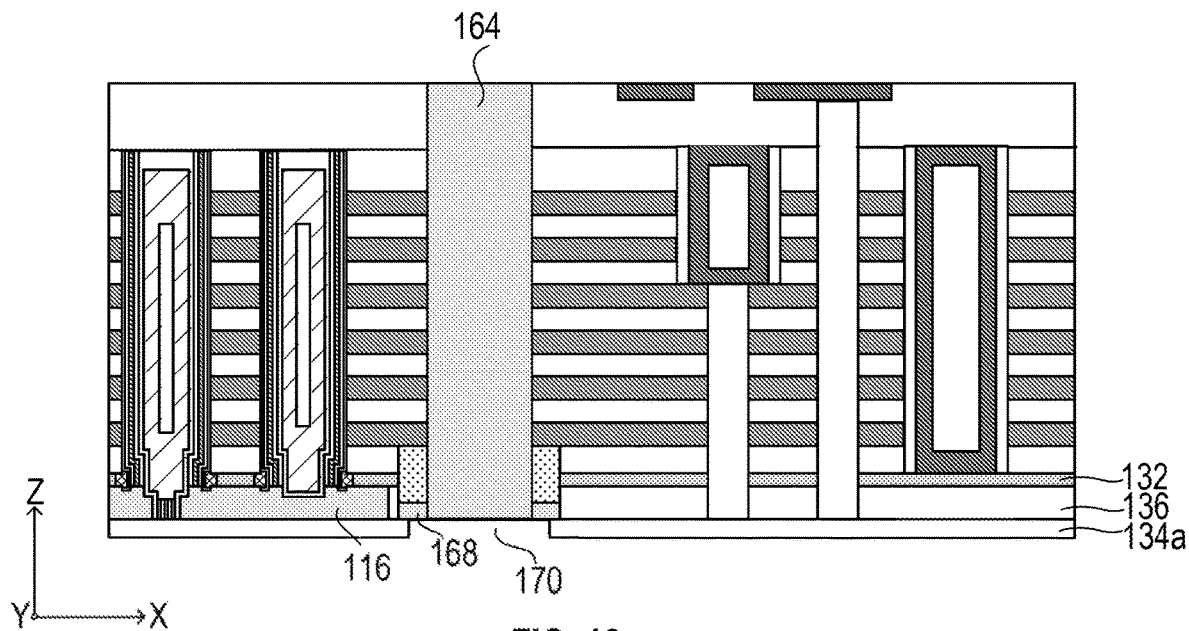
Figure 19:
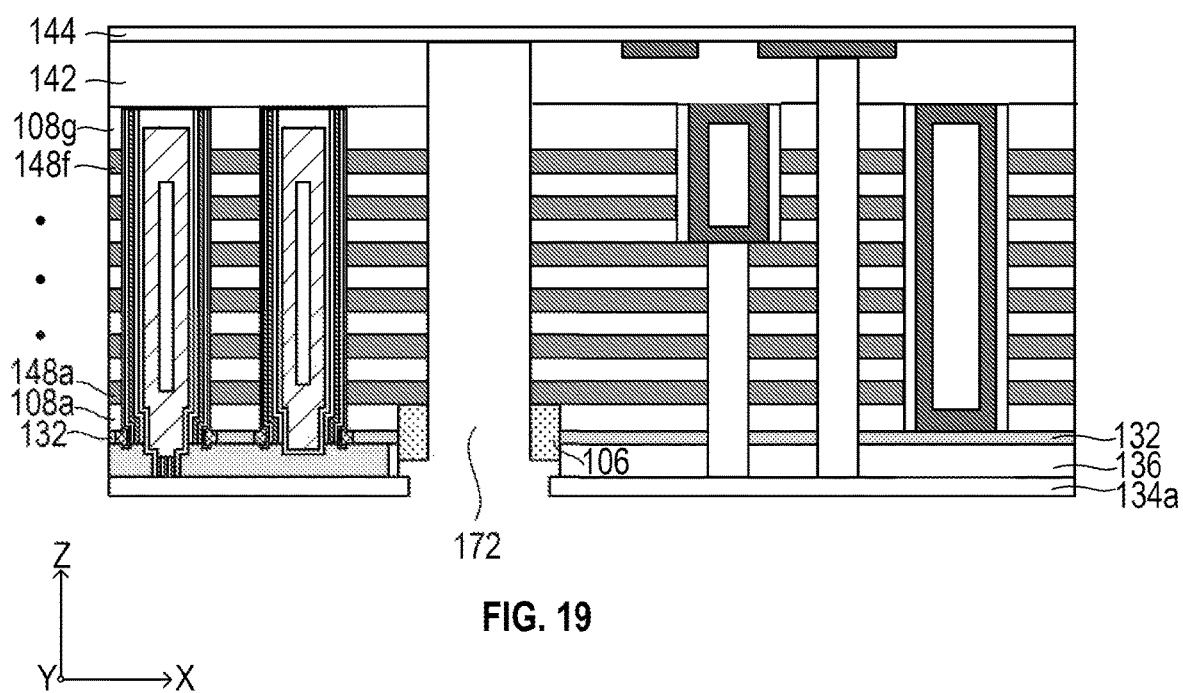

In FIG. 9, a trench opening 162 can be formed by a combination of a photolithography process and an etching process. The trench opening 162 can extend from the first dielectric layer 142 and through the sacrificial layers 148a-148f and the insulating layers 108a-108g. The trench opening 162 can further extend through the dielectric structure 146 and into the substrate 101. The formation of the dielectric structure 146 can ensure the trench opening extends into the substrate 101 with a gouging (or recess depth) H1. As mentioned above, the dielectric structure 146 can be made of SiO, which can have a larger etch rate than the substrate 101 that is made of Si. In the disclosure, in order to form the gouging H1, the etching process can etch through the dielectric structure 146 at first and then recess the substrate 101 with a depth of H2. However, in the related examples, the dielectric structure 146 may not exist. In order to form the gouging H1, the etching process has to recess the substrate 101 with a depth H1 Thus, the etching process in the disclosure can etch less Si substrate than the etching process in the related examples. Accordingly, the etching process in the disclosure can have a larger process window than the etching process in the related examples to form the gouging H1. The etching process in the related examples may recess the substrate 101 with a shallower gouging than H1 or even fail to recess the substrate 101. While the trench opening 162 is shown to be recessed into the substrate with the depth H2 at the bottom of the dielectric structure 146 in the FIG. 9 example, the trench opening 162 can extend passing the upper surface of the substrate 101 but not passing the bottom surface of the dielectric structure 146 in another example. This can still be effective to facilitate forming a slit opening 162 from the backside of the device 100 as shown in FIG. 11, FIG. 18 and FIG. 19. Further, while the dielectric structure 146 is shown to be recessed into the substrate 101 in FIG. 9 example, the dielectric structure 146 can be formed passing through the process stop layers 132 and 149 but not reach or recess into the substrate 101 in other examples. Such a formation of the dielectric structure 146 removes portions of the process stop layers 132 and 149 that may prevent the slit opening 162 from penetrating the process stop layers 132 and 149 and extending into the substrate 101.

Figure 10:
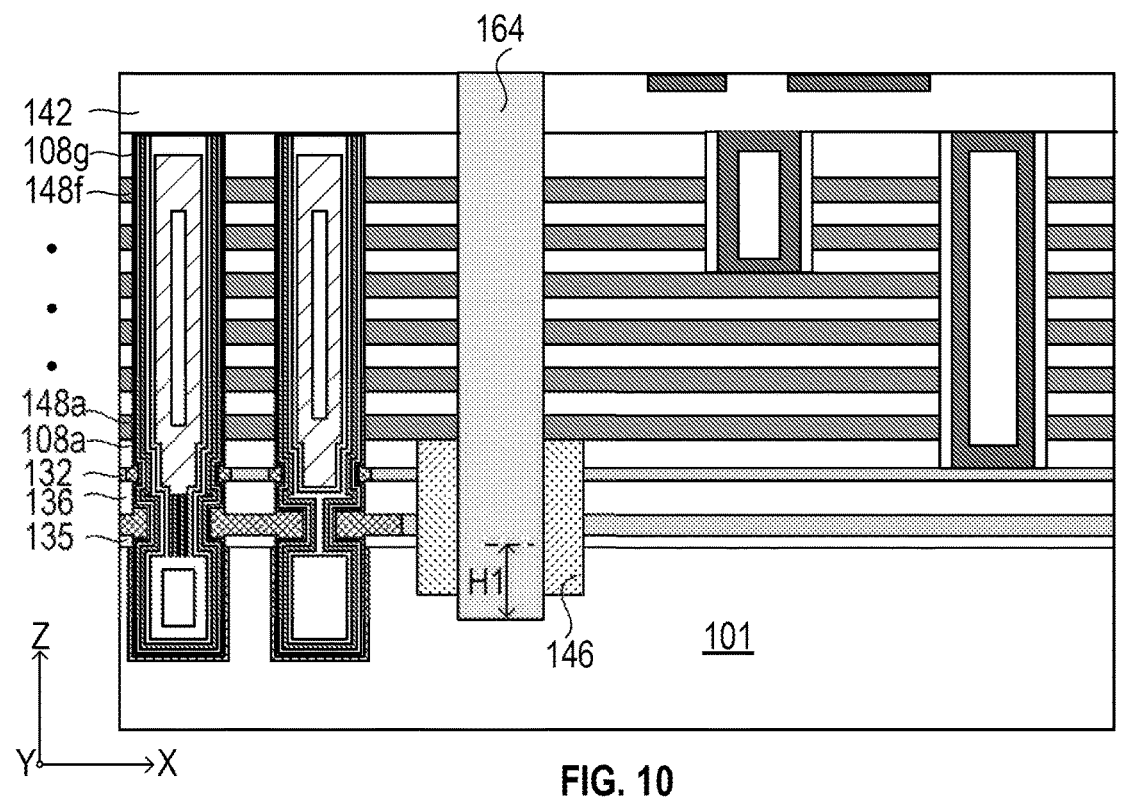

In FIG. 10, in an example, a semiconductor material, such as polysilicon, can be deposited into the trench opening 162 to form a sacrificial slit structure 164. The sacrificial slit structure 164 can extend from the first dielectric layer 142, through the sacrificial layers 148a-148f, the insulating layers 108a-108g, the dielectric structure 146, and into the substrate 101 with the gouging H1. In another example (not shown), a dielectric material can be deposited into the trench opening 162 to form the sacrificial slit structure 164.

In FIG. 11, a CMP process can be applied to remove the substrate 101. The CMP process can further remove the portions of the channel structures 118a-118b that are positioned in the substrate 101, a portion of the sacrificial slit structure 164 positioned in the substrate 101, and the a portion of the dielectric structure 146 positioned in the substrate 101.

Figure 12:
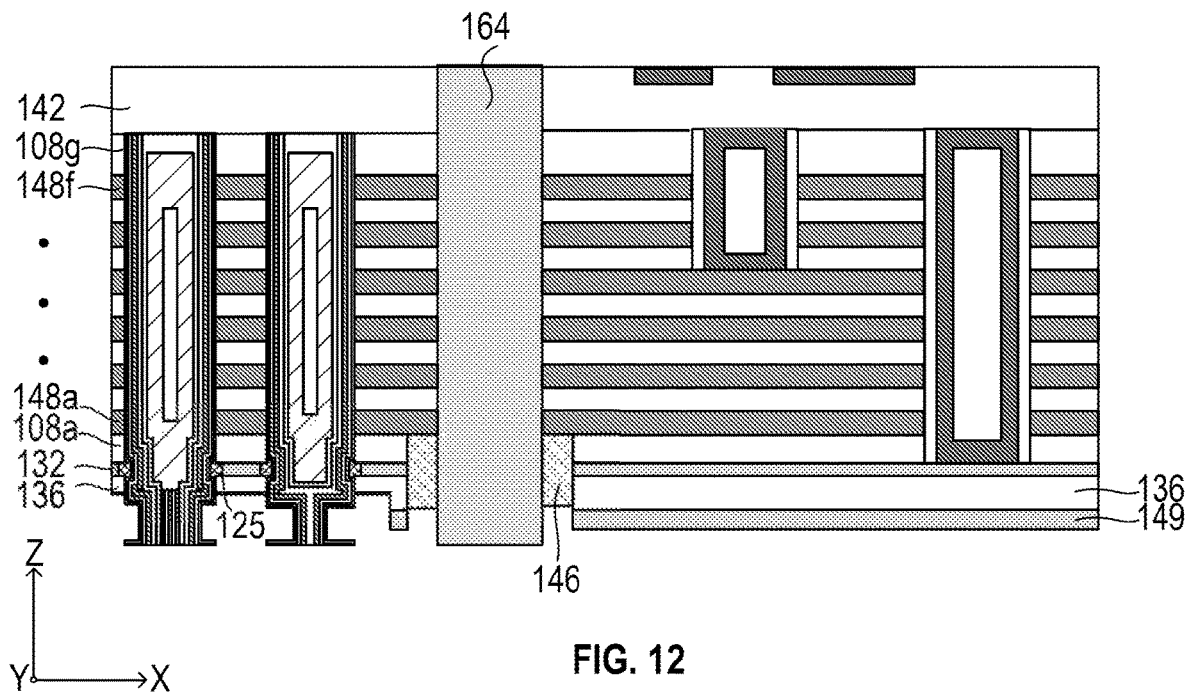

In FIG. 12, the isolation layer 135, the bottom oxide layers 127, a portion of the isolation layer 136 in contact with the channel structures 118a-118b, and a portion of the dielectric structure 146 that is in contact with (or surrounded by) the process stop layer 149 can be removed by an etching process, such as a plasma dry etch process or a wet etch process. In some embodiments, the isolation layer 135, the bottom oxide layers 127, and the portion of the dielectric structure 146 that is in contact with the process stop layer 149 can be made of SiO. Accordingly, a plasma dry etch process can apply a fluorine based etching gas, such as $CF_4$. A wet etch process can apply a hydrofluoric acid.

Figure 13:
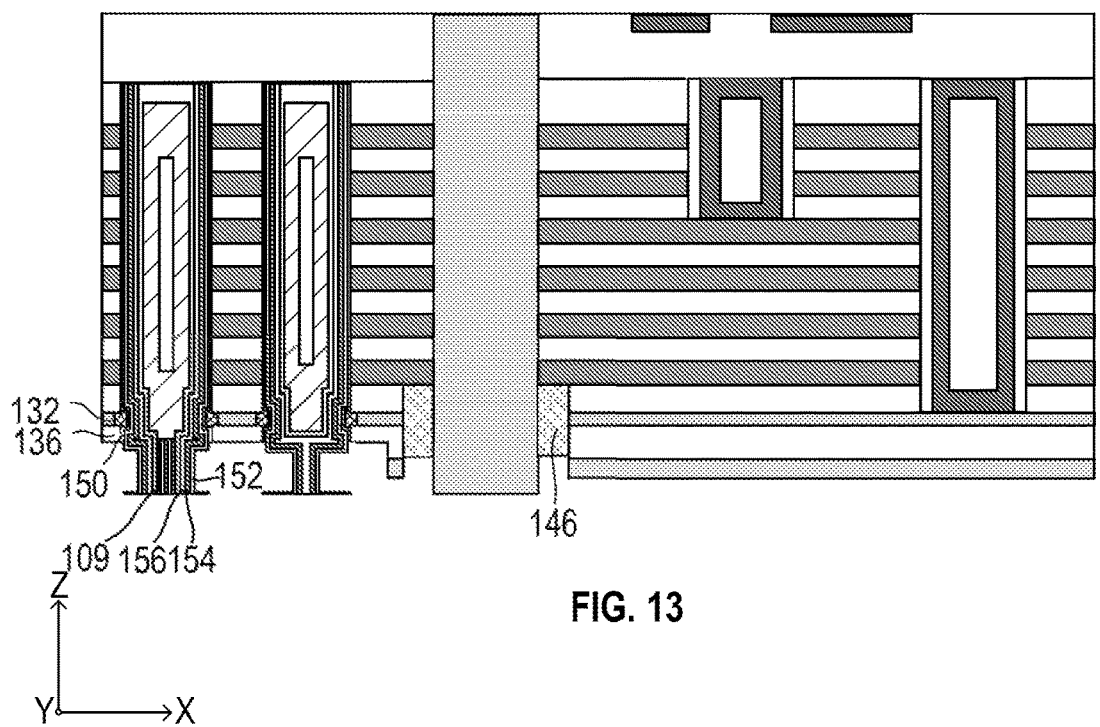

In FIG. 13, a portion of the high-k layer 150 that was exposed as a result of the prior processes of the FIG. 12 example can be removed by a first selective etching process. The first selective etching process can selectively remove the high-k layer 150. The block layer 152, the charge trapping layer 154, the tunneling layer 156, the channel layer 109, the isolation layer 136, and the dielectric structure 146 can still remain.

Figure 14:
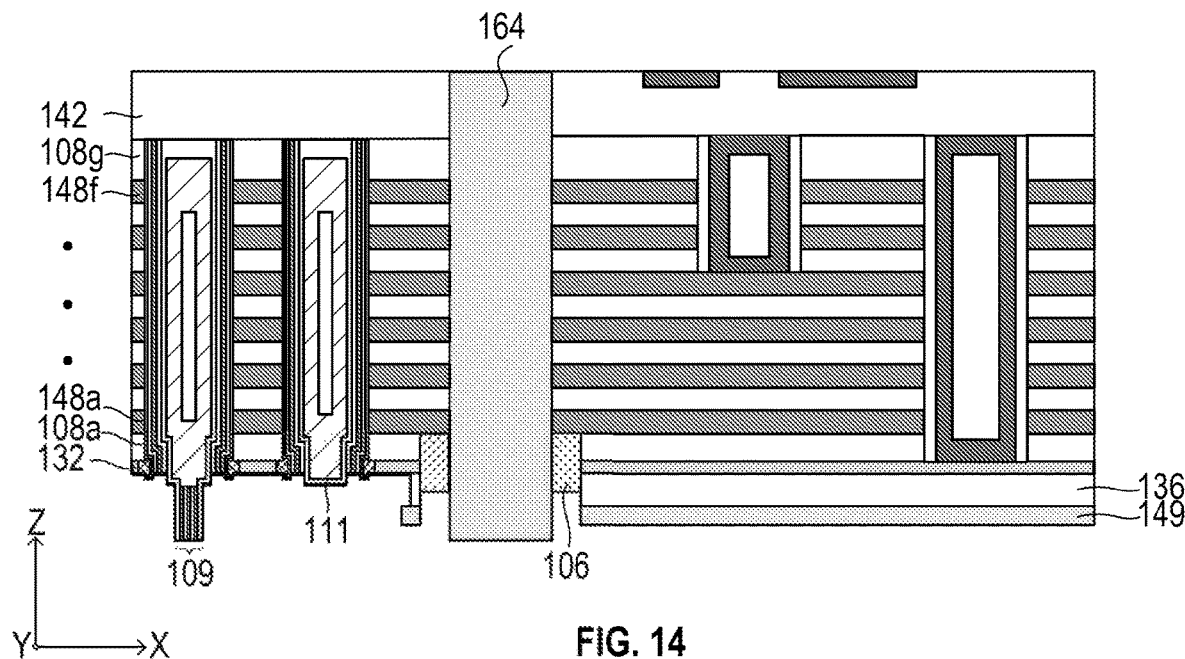

In FIG. 14, the block layer 152, the charge trapping layer 154, and the tunneling layer 156 that were covered by the isolation layer 135 and the bottom oxide layers 127 can further be removed by a second selective etching process. The second selective etching process can also remove a portion of the dielectric structure 146 and a portion of the isolation layer 136 that is in contact with the channel structures 118a-118b and the process stop layer 132. When the second selective etching process is completed, the channel layers 109 and 111 can still remain in the channel structure 118a and 118b respectively. It should be noted that the remaining dielectric structure 146 can become a first dielectric structure 106.

Figure 15:
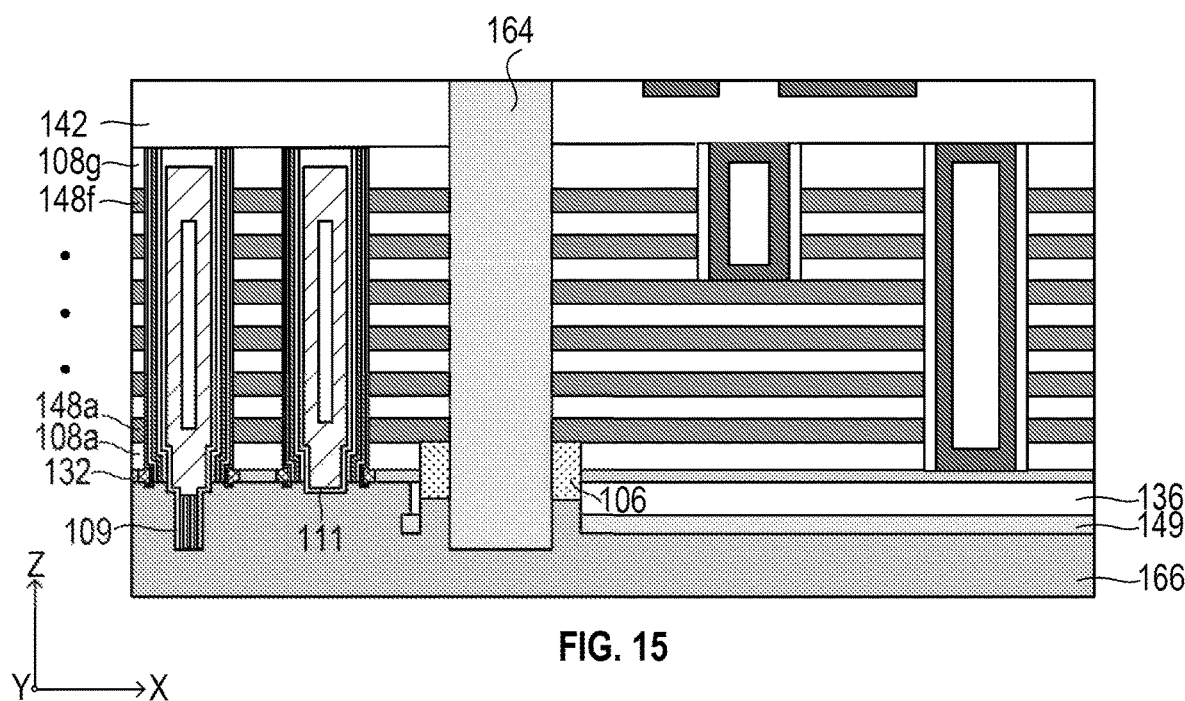

In FIG. 15, a semiconductor layer 166 can be formed. The semiconductor layer 166 can be made of polysilicon, Ge, SiG, SiC, or other suitable semiconductor materials. The semiconductor layer 166 can be in contact with the process stop layer 149, the sacrificial slit structure 164, and the first dielectric structure 106. The semiconductor layer 166 can further be in contact with the process stop layer 132 and the channel layers 109 and 111.

Figure 16:
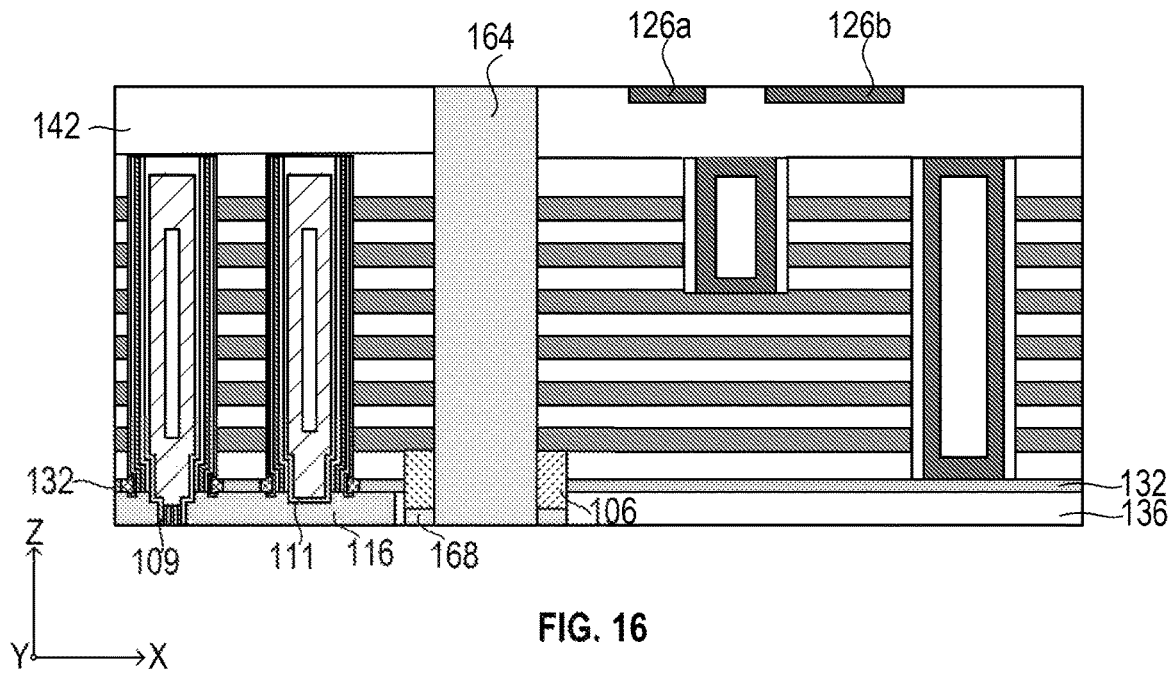

In FIG. 16, a CMP process can be applied to remove a portion of the semiconductor layer 166 in a Z direction. The CMP process can further remove the process stop layer 149 and stop at the isolation layer 136 that is positioned between the process stop layers 132 and 149. When the CMP process is completed, the remaining semiconductor layer 166 can include a semiconductor layer 116 and a semiconductor layer 168. The semiconductor layer 116 can be in contact with the process stop layer 132 and the channel layers 109 and 111. The semiconductor layer 168 can be positioned in the isolation layer 136, and in contact with the first dielectric structure 106 and the sacrificial slit structure 164.

Figure 17:
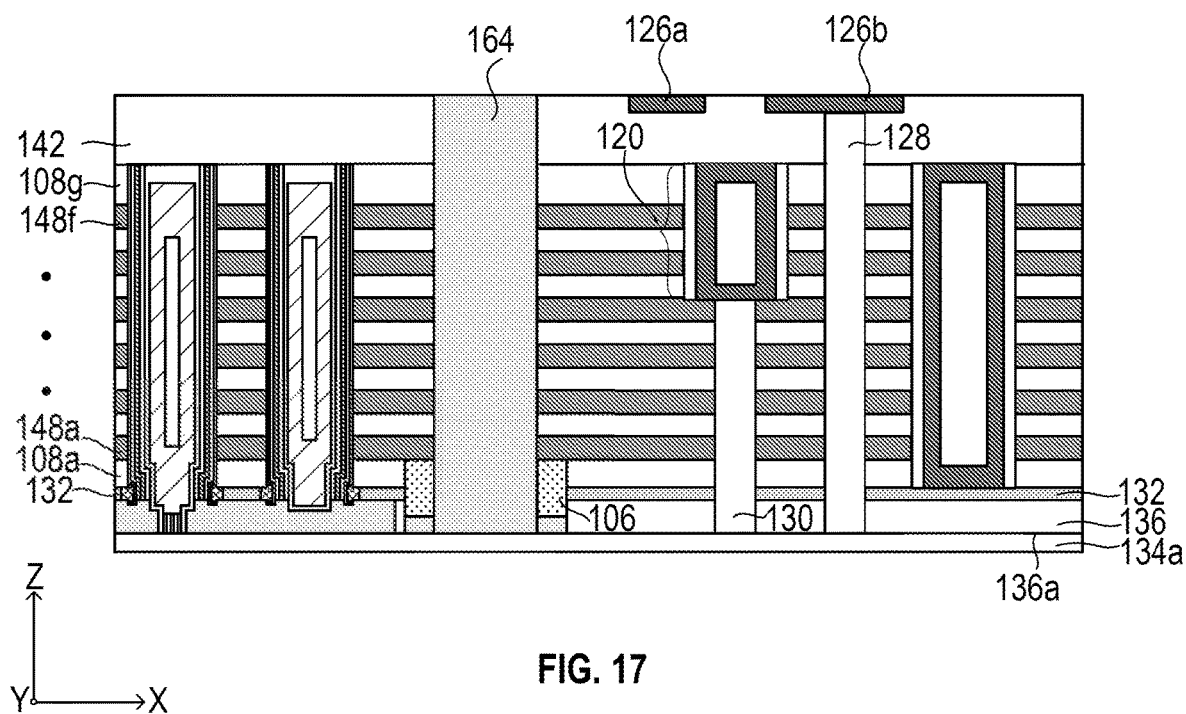

In FIG. 17, a first dummy channel structure 128 can be formed to extend from the isolation layer 136 and further through the sacrificial layers 148a-148f and the insulating layers 108a-108g to contact the etch stop layer 126b. A second dummy channel structure 130 can be formed to extend from the isolation layer 136 and further through the sacrificial layers 148a-148d and the insulating layers 108a-108d to contact the first contact 120. In order to form the first and second dummy channel structures 128 and 130, a first dummy channel opening and a second dummy channel opening can be formed. The first dummy channel opening can extend from the isolation layer 136 and further through the sacrificial layers 148a-148f and the insulating layers 108a-108g to expose the etch stop layer 126b. The second dummy channel opening can extend from the isolation layer 136 and further through the sacrificial layers 148a-148d and the insulating layers 108a-108d to expose the first contact 120. A dielectric material, such as SiO, can be deposited to fill the first dummy channel opening and the second dummy channel opening to form the first dummy channel structure 128 and the second dummy channel structure 130 respectively. The dielectric material can also be deposited over a surface 136a of the isolation layer 136 to form a first cap layer 134a.

In FIG. 18, an opening 170 can be formed in the first cap layer 134a. The opening 170 can extend through the first cap layer 134a to expose the sacrificial slit structure 164 and the semiconductor layer 168.

In FIG. 19, a second dielectric layer 144 can be formed over and in contact with the first dielectric layer 142 and the sacrificial slit structure 164. An etching process can be applied to remove the sacrificial slit structure 164 and the semiconductor layer 168 to form a slit opening 172. As shown in FIG. 19, the slit opening 172 can extend from the first cap layer 134a, through the first dielectric structure 106, the sacrificial layers 148a-148f, the insulating layers 108a-108g, and the first dielectric layer 142. The slit opening 172 can further expose the second dielectric layer 144.

Figure 20:
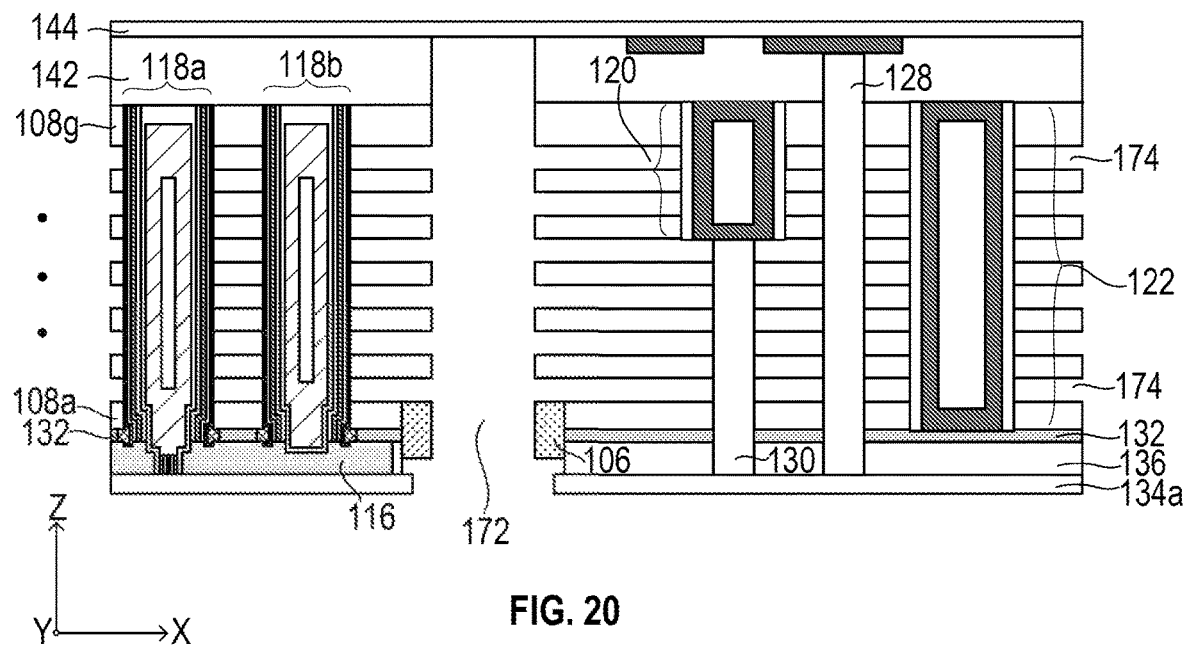

In FIG. 20, the sacrificial layer 148a-148f can be removed by an etching process, such as a wet etching process. For example, tetramethylammonium hydroxide (TMAH) can be applied to selectively remove the sacrificial layers 148a-148f. When the sacrificial layers 148a-148f are removed, spaces 174 can be formed between the insulating layers 108a-108g. Accordingly, sidewalls of the channel structures 118a-118b, the first and second contacts 120 and 128, and the first and second dummy channel structures 128 and 130 that were in contact with the sacrificial layers 148a-148f can be exposed by the spaces 174.

Figure 21:
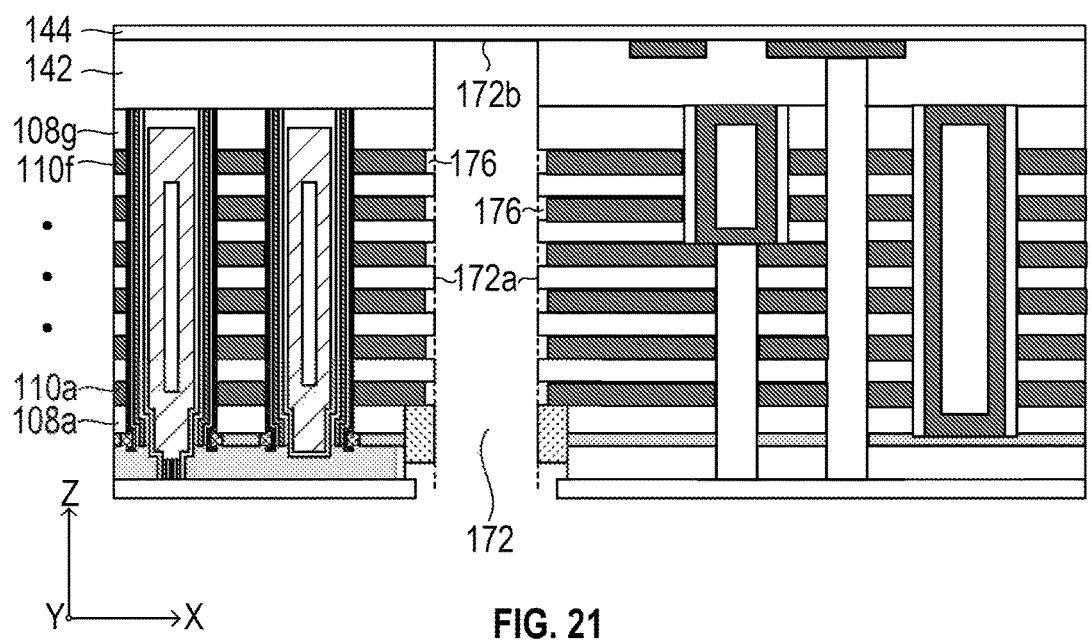

In FIG. 21, a conductive material, such as tungsten, can be deposited to fill the spaces 174 to form word line layers 110a-110f such that the word line layers 110a-110f can be arranged between the insulating layers 108a-108g. The conductive material can further be deposited along sidewalls 172a and over a bottom 172b of the slit opening 172. An etching process can subsequently be applied to remove the conductive materials deposited on the sidewalls and over the bottom of the split opening 172. The etching process can further recess the word line layers 110a-110f in the horizontal direction (e.g., X direction) from the sidewalls 172a of the slit opening 172. Accordingly, gaps 176 can be formed between the sidewalls 172a of the slit opening 172 and the word line layers 110a-110f. In some examples, before filing the spaces 174 with the conductive material, a liner (not shown) can be formed over the spaces 174. In an example, the liner is made of TiN. In an example, the liner (not shown) can also be removed from the sidewalls and the bottom of the split opening 172 as well as the gaps 176 during the etching process.

Figure 22:
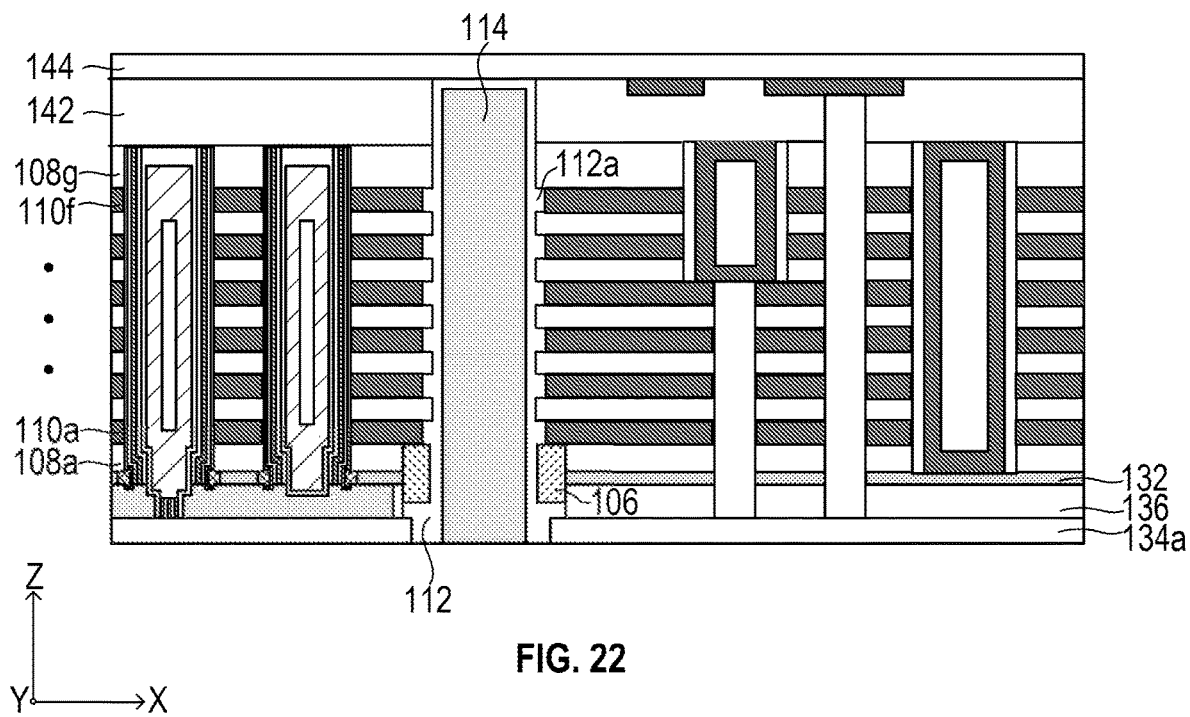

In FIG. 22, a deposition process can be applied to deposit a dielectric material, such as SiO, along the sidewalls 172a and over the bottom 172b of the slit opening 172. The dielectric material can also fill the gaps 176. A second dielectric structure 112 can accordingly be formed by the deposition process. As shown in FIG. 22, the second dielectric structure 112 can extend from the first cap layer 134a, through the first dielectric structure 106, the word line layers 110a-110f, and the insulating layers 108a-108g, enter the first dielectric layer 142, and contact the second dielectric layer 144. The second dielectric structure 112 can also include protrusions 112a extending to and in contact with the word line layers 110a-110f in the X direction. The slit structure 114 can subsequently be formed, for example, by filling a conductive or dielectric material into the opening inside the second dielectric structure 112. The slit structure 114 can also be referred to as a replaced slit structure 114.

Figure 23:
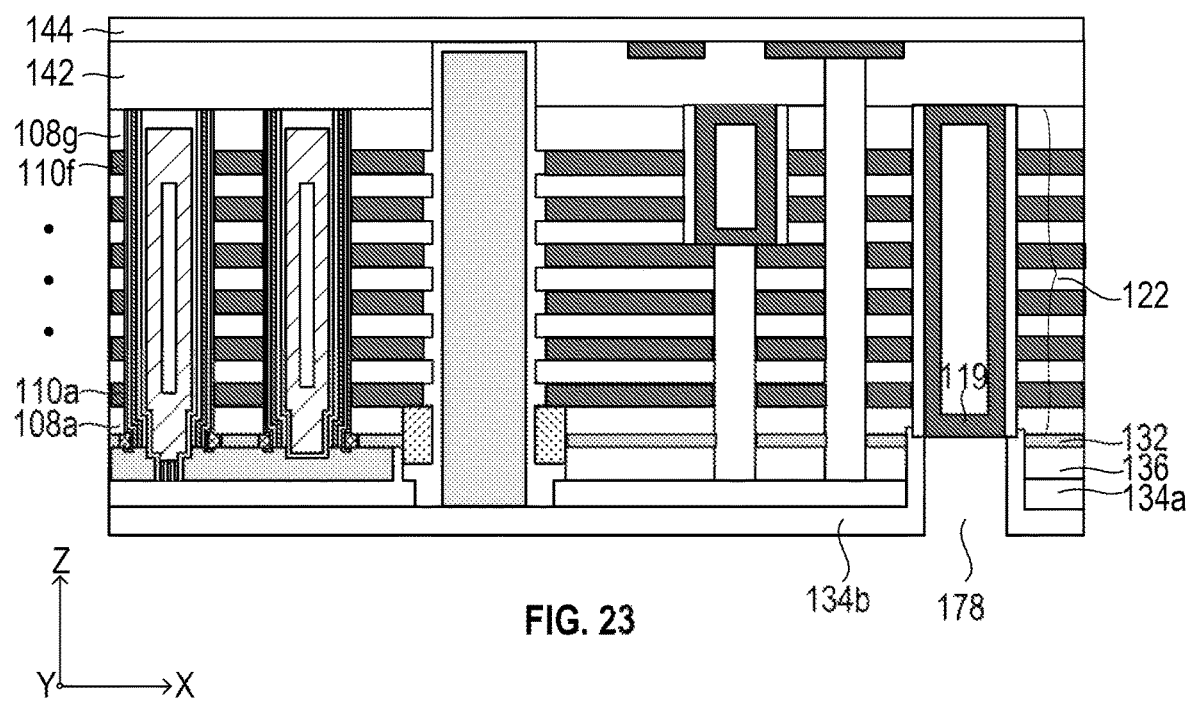

In FIG. 23, an etching process can be applied to form a contact opening 178 in the isolation layer 136 and the first cap layer 134a. The contact opening 178 can extend through the process stop layer 132, the isolation layer 136 and the first cap layer 134a to expose the bottom portion 119 of the second contact 122. Further, a second cap layer 134b can be formed that is disposed over the first cap layer 134a and along sidewalls of the contact opening 178. The second cap layer 134b can also be deposited to cover the bottom portion 119 of the second contact 122. A plasma punch process can subsequently be applied to remove the portion of the second cap layers 134b that covers the bottom portion 119 of the second contact 122.

Figure 24:
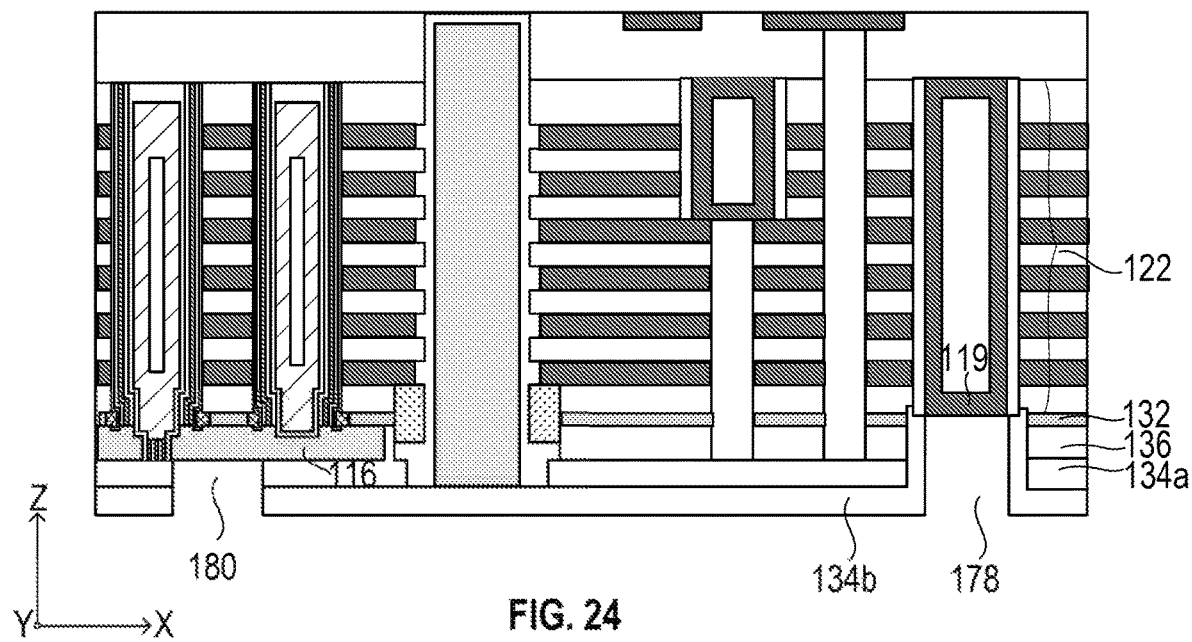
Figure 25:
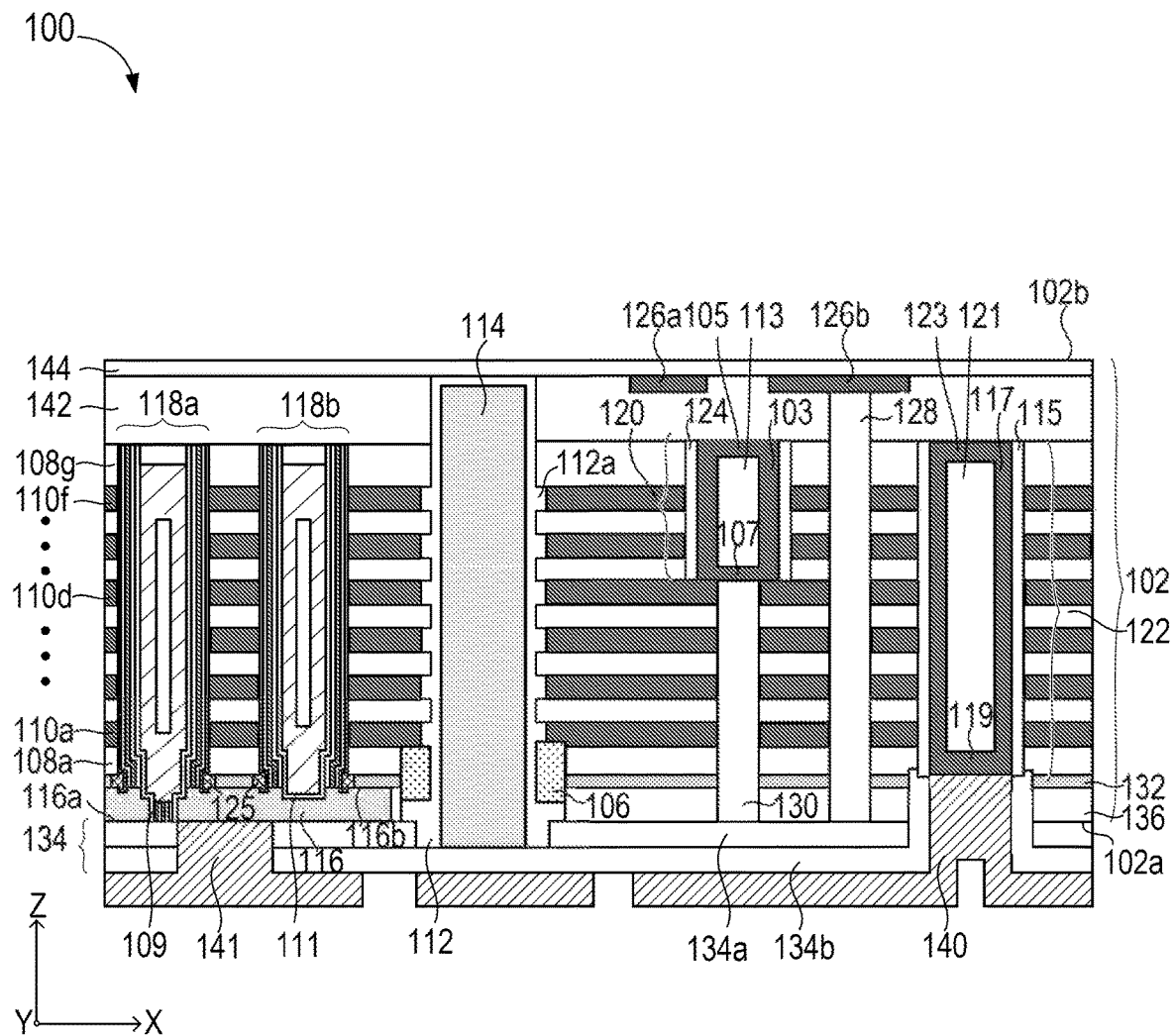

In FIG. 24, a contact opening 180 can be formed to extend through the first and second cap layers 134a-134b and expose the semiconductor layer 116. In FIG. 25, a conductive material, such as Al, can be deposited to fill the contact openings 178 and 180. The conductive material can further cover the second cap layer 134b. A metal etching process can be applied to divide the conductive material into a plurality of pad structures, such as a first pad structure 141 and a second pad structure 140. The second pad structure 140 can extend through the first and second cap layers 134a and 134b to contact the second contact 122. The first pad structure 141 can extend through the first and second cap layers 134a and 134b to contact the semiconductor layer 116.

When the pad structures are formed, a device 100 can be formed accordingly. As shown in FIG. 25, the device 100 can have features similar to the device 100 shown in FIG. 1. For example, the device 100 in FIG. 25 can include word line layers 110a-110f positioned in a stack 102. The stack 102 can include the first dielectric layer 142 over an uppermost insulating layer 108g of the insulating layers 108a-108g, and the second dielectric layer 144 over the first dielectric layer 142. The stack 102 can include the process stop layer 132 in contact with a lowermost insulating layer 108a of the insulating layers 108a-108g and an isolation layer in contact with the process stop layer 132. A first cap layer 134a can be in contact with the isolation layer 136, and a second cap layer 134b can be in contact with the first cap layer 134a. The device 100 can include the channel structures 118a-118b that can extend from the uppermost insulating layer 108g and through the word line layers 110a-110f and the insulating layers 108a-108g. The device 100 can include the first contact 120 extending from the uppermost insulating layer 108g and into a portion of the word line layers 110a-110f and the insulating layers 108a-108g to contact the word line layer 110d. The device 100 can also include the second contact 122 extending from the uppermost insulating layer 108g and through the word line layers 110a-110f and the insulating layers 108a-108g. The first dummy channel structure 128 of the device 100 can extend from the isolation layer 136, through the word line layers 110a-110f and the insulating layers 108a-108g, and contact the etch stop layer 126b. The second dummy channel structure 130 of the device 100 can extend from the isolation layer 136, through the word line layers 110a-110d and the insulating layers 108a-108d, and contact the first contact 120.

As described herein, in various embodiments, one or more of the following novel processes and structures have been adopted to form the device 100: backside GLS open process; embedding a trench (the dielectric structure 146) before the forming of the sacrificial slit structure 164 to facilitate the backside GLS open process; backside DCH process to form the DCH 130 or 128; a process order of forming the semiconductor layer 116 followed by forming the DCHs (such as DCHs 130 and 128) first and the slit structure 114 subsequently; the SCTs 120 and 122 with a specific structure; and etch stop layers 126a and 126b above the stack of the alternating word line layers 110a-110f and insulating layers 108a-108g. Those novel processes and structures do not reply on each other and can be separately adopted in various embodiments. For example, any number of those processes and structures can be suitably combined to manufacture various devices.

As described herein, in the specific examples shown in FIG. 1 and FIG. 25, the device 100 has the following structural characteristics which, in some cases, is related with the above novel processes or structures adopted for manufacturing the device 100. The bottom position of the slit structure 114 is lower than the bottom position of the channel structure 118a or 118b. The bottom positions of the DCHs 130 and 128 are lower than the bottom position of the channel structure 118a or 118b. The DCH 130 is positioned below the SCT 120. The level of the top end of the DCH 128 is higher than the top surface of the SCT 120 or 122. In addition, the process stop layer 132 (for example, a layer of polysilicon) can be recessed with respect to the slit structure 114 compared with the word line layers 110a-110f. The semiconductor layer 116 can be recessed with respect to the slit structure 114 compared with the word line layers 110a-110f or the process stop layer 132.

Figure 26:
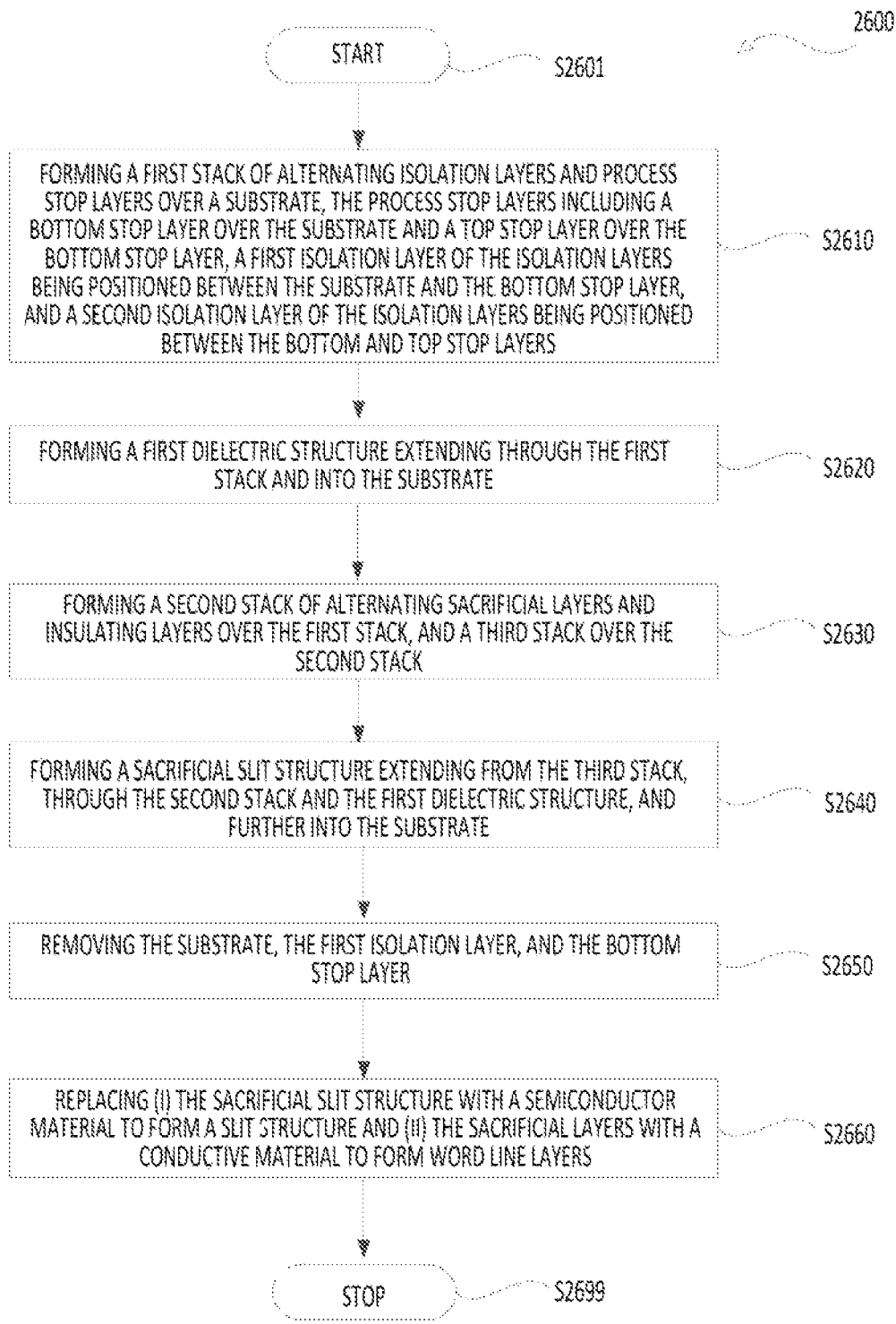
FIG. 26 is a flowchart of a process for manufacturing a 3D NAND memory device, in accordance with exemplary embodiments of the disclosure.

FIG. 26 is a flowchart of an exemplary process 2600 for fabricating a 3D NAND memory device. The process 2600 begins with S2601, and then proceeds to S2610. At S2610, a first stack (such as the stack 104 in FIG. 2) of alternating isolation layers and process stop layers can be formed over a substrate, where the process stop layers can include a bottom stop layer over the substrate and a top stop layer over the bottom stop layer. In addition, a first isolation layer of the isolation layers can be arranged between the substrate and the bottom stop layer, and a second isolation layer of the isolation layers can be arranged between the bottom and top stop layers. In some embodiments, S2610 can be performed as illustrated with reference to FIG. 2.

At S2620, a first dielectric structure can be formed to extend through the first stack and into the substrate. In some embodiments, S2620 can be performed as illustrated with reference to FIGS. 3-4.

At S2630, a second stack (such as a stack including the sacrificial layers 148a-148f and insulating layers 108b-108g in FIG. 5) of alternating sacrificial layers and insulating layers can be formed over the first stack, and a third stack (such as a stack including the first dielectric layer 142 and the etch stop layer 126a-126b in FIG. 8) can be formed over the second stack. In some embodiments, S2630 can be performed as illustrated with reference to FIGS. 5 and 8.

At S2640, a sacrificial slit structure can be formed to extend from the third stack, through the second stack and the first dielectric structure, and further into the substrate. In some embodiments, S2640 can be performed as illustrated with reference to FIGS. 9-10.

At S2650, the substrate, the first isolation layer, and the bottom stop layer can be removed. In some embodiments, S2650 can be performed as illustrated with reference to FIGS. 11-14.

At S2660, the sacrificial slit structure can be replaced with a semiconductor material to form a slit structure and the sacrificial layers can be replaced with a conductive material to form word line layers. In some embodiments, S2660 can be performed as illustrated with reference to FIGS. 15-22.

In the process 2600, before the sacrificial slit structure is formed, a channel structure can be formed to extend through the second stack and further into the substrate, which can be shown in FIGS. 5-6. In addition, as shown in FIGS. 7-8, a first contact can be formed to extend from an uppermost insulating layer of the insulating layers and into the second stack to contact one of the sacrificial layers. A second contact can be formed to extend from the uppermost insulating layer and through the second stack such that the second contact is in contact with the top stop layer. A first dielectric layer of the third stack can be formed over the second stack and an etch stop layer can be formed in the first dielectric layer.

To form the channel structure, as shown in FIG. 5, a channel opening can be formed. The channel opening can include sidewalls and extends through the second stack and the first stack, and a bottom into the substrate. Portions of the bottom and top stop layers that are exposed by the sidewalls of the channel opening can be oxidized to form a bottom oxide layer and a top oxide layer extending into the channel opening along a horizontal direction parallel to the substrate. As shown in FIG. 6, a high-k layer can be formed along the sidewalls and over the bottom of the channel opening. A block layer can be formed over the high-k layer. A charge trapping layer can be formed over the block layer. A tunneling layer can be formed over the charge trapping layer. A channel layer can be formed over the tunneling layer. A channel isolation layer can be formed over the channel layer. A channel contact can be formed over the channel isolation layer and in contact with the channel layer.

To form the sacrificial slit structure, as shown in FIG. 9, a trench opening can be formed to extend through the first dielectric layer of the third stack, the second stack, the first dielectric structure, and into the substrate. As shown in FIG. 10, the trench opening can be filled with a sacrificial semiconductor material to form the sacrificial slit structure.

To remove the substrate, as shown in FIG. 11, the first isolation layer, and the bottom stop layer, the substrate and a portion of the channel structure positioned in the substrate can be removed. As shown in FIG. 12, the bottom oxide layer, the first isolation layer, and a portion of the first dielectric structure that is in contact with the bottom stop layer can also be removed. Further, as shown in FIGS. 13-14, the high-k layer, the block layer, the charge trapping layer, and the tunneling layer that were surrounded by the bottom oxide layer and the first isolation layer can be removed. As shown in FIG. 15, a semiconductor layer can subsequently be formed to be in contact with the bottom stop layer, the sacrificial slit structure, and the channel structure. As shown in FIG. 16, a portion of the semiconductor layer, the bottom stop layer, and a portion of the second isolation layer can be removed. A remaining portion of the semiconductor layer can be in contact with the channel structure, the top stop layer, and the second isolation layer.

In the process 2600, as shown in FIG. 17, a first dummy channel structure can be formed to extend from the second isolation layer and through the first stack and the second stack to contact the etch stop layer. A second dummy channel structure can be formed to extend from the second isolation layer, through the first stack, and further into the second stack to contact the first contact. A first cap layer can be formed to be in contact with the second isolation layer and the remaining portion of the semiconductor layer.

In the process 2600, as shown in FIGS. 18-22, to replace the sacrificial slit structure and the sacrificial layers, a second dielectric layer of the third stack can be formed on the first dielectric layer of the third stack. The sacrificial slit structure can be removed through an etching process to form a slit opening. The slit opening can have sidewalls extending from the first cap layer, through the first dielectric structure and the second stack, and a bottom extending into the third stack to expose the second dielectric layer of the third stack. An etching chemistry can be introduced into the slit opening to remove the sacrificial layers such that spaces are formed between the insulating layers. The spaces can be filled with the conductive material to form the word line layers such that the word line layers and the insulating layers are arranged alternatingly. A second dielectric structure can be formed along sidewalls and over the bottom of the slit opening. The semiconductor material can be deposited over the second dielectric structure in the slit opening to form the slit structure.

In the process 2600, as shown in FIGS. 23-25, a second cap layer that is in contact with the first cap layer can be formed. A first pad structure can be formed to extend through the first and second cap layers to contact the remaining portion of the semiconductor layer. A second pad structure can be formed to extend through the first and second cap layers and the second isolation layer to contact the second contact.

In some embodiments, the first dielectric structure can be surrounded by a lowermost insulating layer of the insulating layers and in contact with a lowermost word line layer of the word line layers. The second dielectric structure can extend through the first cap layer, the first dielectric structure, and the word line layers and the insulating layers. The second dielectric structure can further include protrusions extending to and in contact with the word line layers in the horizontal direction parallel to the word line layers.

It should be noted that additional steps can be provided before, during, and after the process 2600, and some of the steps described can be replaced, eliminated, or performed in different order for additional embodiments of the process 2600. In subsequent process steps, various additional interconnect structures (e.g., metallization layers having conductive lines and/or VIAs) or periphery structures may be formed over the 3D NAND memory device (e.g., 100). The periphery structures can form control circuitry to operate the device 3D NAND memory device. The interconnect structures can electrically connect the 3D NAND memory device with the periphery structures or other contact structures and/or active devices to form functional circuits. Additional device features such as passivation layers, input/output structures, and the like may also be formed.

Figure 27:
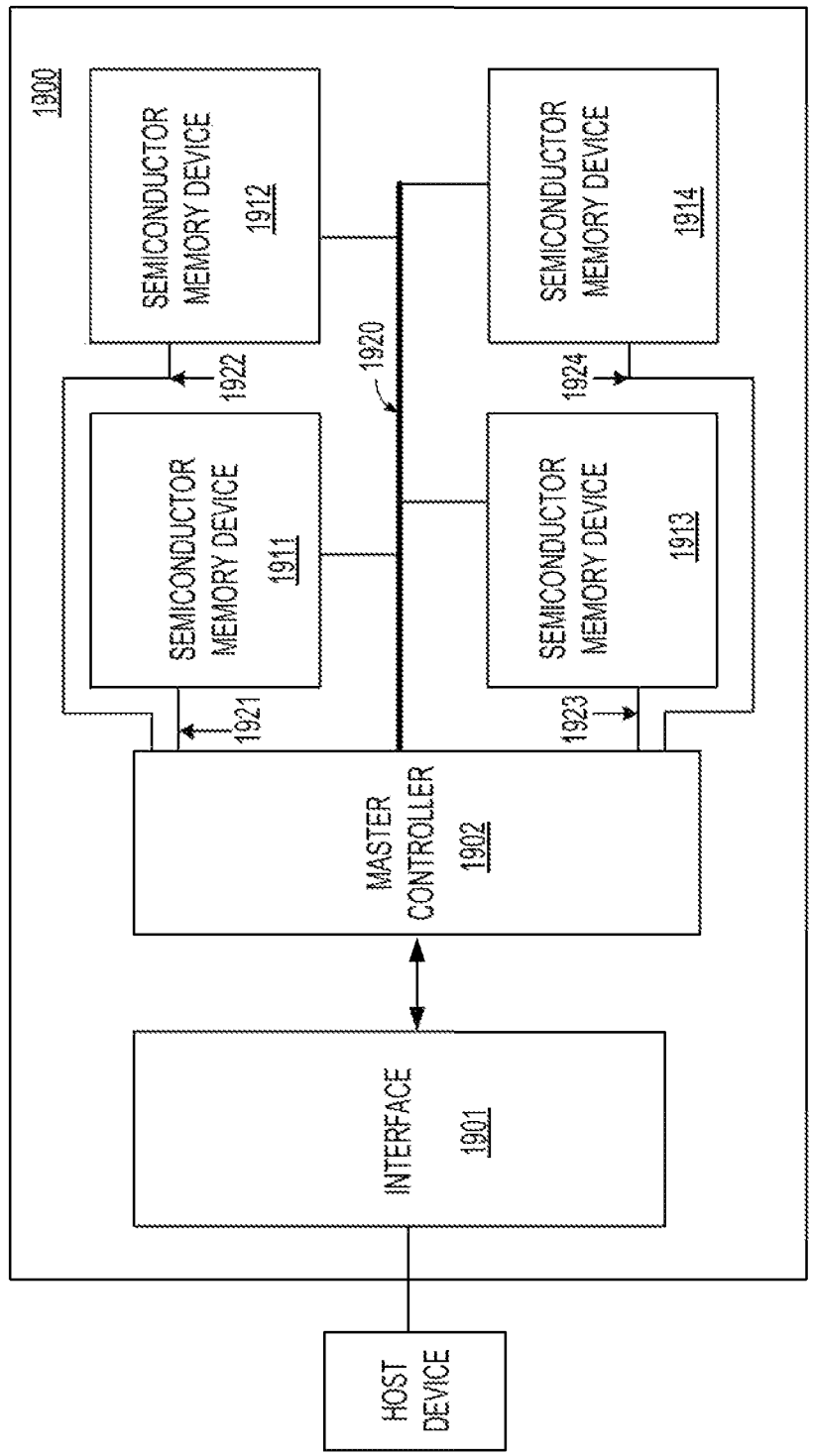
FIG. 27 is a block diagram of a memory system device according to some exemplary embodiments of the disclosure.

FIG. 27 shows a block diagram of a memory system device 1900 according to some examples of the disclosure. The memory system device 1900 includes one or more semiconductor memory devices, such as shown by semiconductor memory devices 1911-1914, that can be respectively configured similarly as the device 100 in FIGS. 1 and 25. In some examples, the memory system device 1900 is a solid state drive (SSD) or a memory module.

The memory system device 1900 can include other suitable components. For example, the memory system device 1900 includes an interface (or master interface circuitry) 1901 and a master controller (or master control circuitry) 1902 coupled together as shown in FIG. 27. The memory system device 1900 can include a bus 1920 that couples the master controller 1902 with the semiconductor memory devices 1911-1914. In addition, the master controller 1902 is connected with the semiconductor memory devices 1911-1914 respectively, such as shown by respective control lines 1921-1924.

The interface 1901 is suitably configured mechanically and electrically to connect between the memory system device 1900 and a host device, and can be used to transfer data between the memory system device 1900 and the host device.

The master controller 1902 is configured to connect the respective semiconductor memory devices 1911-1914 to the interface 1901 for data transfer. For example, the master controller 1902 is configured to provide enable/disable signals respectively to the semiconductor memory devices 1911-1914 to activate one or more semiconductor memory devices 1911-1914 for data transfer.

The master controller 1902 is responsible for the completion of various instructions within the memory system device 1900. For example, the master controller 1902 can perform bad block management, error checking and correction, garbage collection, and the like. In some embodiments, the master controller 1902 is implemented using a processor chip. In some examples, the master controller 1902 is implemented using multiple master control units (MCUs).

The various embodiments described herein offer several advantages over related examples. For example, in the disclosure, stair step contacts (SCTs) can be formed to function as word line contacts. The SCTs can be formed by applying processes that, for example, include an oxide deposition, an etching, a tungsten deposition, an oxide filling, and a tungsten plug formation to complete the word line contact formation, and the connection and isolation between the word line contacts and the word line layers. The stair step area around the SCTs can include a tungsten plate stop layer to prevent a backside DCH punching through the stair step area. A trench structure can be formed under a GLS in advance and filled with oxide to ensure that the GLS gouging is positioned in the silicon substrate, or is positioned below a bottom polysilicon layer (such as the process stop layer 149) but above the silicon substrate. The backside poly CMP can stop in an oxide layer between a top polysilicon layer and the bottom polysilicon layer, which can be beneficial to control the removal of the GLS sacrificial polysilicon. In the disclosure, the formation of oxide trench structure under GLS can well control the position of GLS gouging, which can be beneficial to control the process window to form the back GLS opening (opened from a backside of the silicon substrate). In addition, methods provided in the disclosure can simplify the 3D NAND process flow and reduce the manufacturing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a stack having a first surface and a second surface opposing the first surface, the stack including word line layers and insulating layers alternating with the word line layers between the first surface and the second surface, the stack further including a process stop layer between the lower most insulating layer of the insulating layers and the first surface, the stack extending along an X-Y plane having an X direction and a Y direction perpendicular to the X direction;
   a contact structure extending in a Z direction perpendicular to the X-Y plane and through the word line layers and the insulating layers of the stack and connecting to a pad structure; and
   a slit structure crossing the stack between the first surface and the second surface in the Z direction, the slit structure also extending along a Y-Z plane perpendicular to the X direction,
   wherein
   in a cross-section perpendicular to the Y direction, distances between the slit structure and the process stop layer at two sides of the slit structure are each larger than distances at either side of the slit structure between the word line layers and the slit structure; and
   a bottom portion of the contact structure is positioned in the lower most insulating layer and over a bottom surface of the process stop layer.

2. The semiconductor device of claim 1, wherein materials exist between the slit structure and the word line layers, between the slit structure and the insulating layers, and between the slit structure and the process stop layer, and the materials include:
   a first dielectric structure and a second dielectric structure, the second dielectric structure extending along the slit structure, the first dielectric structure positioned below the lowermost word line layer and in between the slit structure and the process stop layer.

3. The semiconductor device of claim 2, wherein the second dielectric structure includes protrusions between neighboring insulating layers and extending to the respective ones of the word line layers.

4. The semiconductor device of claim 1, further comprising:
   a semiconductor layer positioned below the process stop layer; and
   a channel structure extending in the Z direction through the word line layers and the insulating layers, and further into the semiconductor layer.

5. The semiconductor device of claim 4, wherein the channel structure further comprises:
   a block layer formed along sidewalls of the channel structure and over the semiconductor layer in the Z direction;
   a charge trapping layer formed along the block layer and over the semiconductor layer in the Z direction;
   a tunneling layer formed along the charge trapping layer and over the semiconductor layer in the Z direction;
   a channel layer formed along the tunneling layer and further extending into the semiconductor layer in the Z direction;
   a channel isolation layer positioned along the channel layer and over the semiconductor layer in the Z direction; and
   a channel contact positioned over the channel isolation layer in the Z direction and in contact with the channel layer.

6. The semiconductor device of claim 1, further comprising:
   a first contact extending from the uppermost insulating layer of the insulating layers in the Z direction to contact one of the word line layers.

7. The semiconductor device of claim 6, wherein the first contact includes:
   a spacer formed along sidewalls of the first contact and over the one of the word line layers,
   a side portion formed along the spacer,
   a bottom portion formed over and in contact with the one of the word line layers,
   a dielectric filler formed along the side portion and over the bottom portion, and
   a top portion formed over the dielectric filler and in contact with the side portion.

8. The semiconductor device of claim 1, further comprising:
   a second contact extending from the uppermost insulating layer and through the word line layers and the insulating layers, wherein the second contact includes:
   a spacer formed along sidewalls of the second contact and in contact with the word line layers and the insulating layers,
   a side portion formed along the spacer,
   a bottom portion over the process stop layer,
   a dielectric filler formed along the side portion and over the bottom portion, and
   a top portion formed over the dielectric filler and in contact with the side portion.

9. The semiconductor device of claim 1, further comprising:
   an etch stop layer included in the stack and over the alternating word line layers and insulating layers; and
   a first dummy channel structure extending into the stack from the first surface of the stack and further through the word line layers and the insulating layers and in contact with the etch stop layer.

10. The semiconductor device of claim 1, further comprising:
    a second dummy channel structure extending into the stack from the first surface of the stack and in contact with a first contact.

11. The semiconductor device of claim 1, further comprising:
    a cap layer formed over the second surface of the stack and in contact with the stack; and
    an isolation layer of the stack positioned between the process stop layer and the cap layer, the slit structure further extending through the isolation layer and into the cap layer.

12. The semiconductor device of claim 11, further comprising:
    a first pad structure extending through the cap layer and in contact with a first surface of a semiconductor layer positioned below the process stop layer; and a second pad structure extending through the cap layer and in contact with a bottom portion of a second contact.

13. A memory system device, comprising:

control circuitry coupled with a memory device; and the memory device comprising:

a stack having a first surface and a second surface opposing the first surface, the stack including word line layers and insulating layers alternating with the word line layers between the first surface and the second surface, the stack further including a process stop layer between the lower most insulating layer and the second surface, the stack extending along an X-Y plane having an X direction and a Y direction perpendicular to the X direction;

a contact structure extending in a Z direction perpendicular to the X-Y plane and through the word line layers and the insulating layers of the stack and connecting to a pad structure; and a slit structure crossing the stack between the first surface and the second surface in the Z direction, the slit structure also extending along a Y-Z plane perpendicular to the X direction, wherein in a cross-section perpendicular to the Y direction, distances between the slit structure and the process stop layer at two sides of the slit structure are each larger than distances at either side of the slit structure between the word line layers and the slit structure; and a bottom portion of the contact structure is positioned in the lower most insulating layer and over a bottom surface of the process stop layer.

14. The memory system device of claim 13, wherein materials exist between the slit structure and the word line layers, between the slit structure and the insulating layers, and between the slit structure and the process stop layer, and the materials include:

a first dielectric structure and a second dielectric structure, the second dielectric structure extending along the slit structure, the first dielectric structure positioned below the lowermost word line layer and in between the slit structure and the process stop layer.

15. The memory system device of claim 14, wherein the second dielectric structure includes protrusions between neighboring insulating layers and extending to the respective ones of the word line layers.

* * * * *